United States Patent
Kawamoto et al.

(10) Patent No.: US 9,890,300 B2
(45) Date of Patent: *Feb. 13, 2018

(54) GERMANIUM SMOOTHING AND CHEMICAL MECHANICAL PLANARIZATION PROCESSES

(71) Applicants: International Business Machines Corporation, Armonk, NY (US); JSR CORPORATION, Tokyo (JP)

(72) Inventors: Tatsuyoshi Kawamoto, Mie (JP); Mahadevaiyer Krishnan, Hopewell Junction, NY (US); Yohei Oishi, White Plains, NY (US); Dinesh Kumar Penigalapati, Guilderland, NY (US); Rachel S. Steiner, New York, NY (US); James A. Tornello, Cortlandt Manor, NY (US); Tatsuya Yamanaka, Mie (JP)

(73) Assignees: International Business Machines Corporation, Armonk, NY (US); JSR Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/490,556

(22) Filed: Apr. 18, 2017

(65) Prior Publication Data

US 2017/0218229 A1    Aug. 3, 2017

Related U.S. Application Data

(62) Division of application No. 15/160,560, filed on May 20, 2016, now Pat. No. 9,646,842.

(Continued)

(51) Int. Cl.
*H01L 21/44* (2006.01)
*C09G 1/02* (2006.01)

(Continued)

(52) U.S. Cl.
CPC .............. *C09G 1/02* (2013.01); *C09K 3/1409* (2013.01); *H01L 21/02532* (2013.01); *H01L 21/02636* (2013.01); *H01L 21/30625* (2013.01)

(58) Field of Classification Search
CPC ................................................. H01L 21/02057

(Continued)

(56) References Cited

U.S. PATENT DOCUMENTS 5,972,073 A    10/1999   Sturgill et al.
7,361,526 B2    4/2008   Maa et al.

(Continued)

OTHER PUBLICATIONS

Wang, L., et al., "The impact of polishing on germanium-on-insulator substrates", Journal of Semiconductors, Aug. 2013, pp. 083005-1 to 083005-5, vol. 34, No. 8.

(Continued)

*Primary Examiner* — Jami M Valentine
(74) *Attorney, Agent, or Firm* — Scully, Scott, Murphy & Presser, P.C.; Louis J. Percello, Esq.

(57) ABSTRACT

Method for chemical mechanical planarization is provided, which includes: forming a dielectric layer containing at least one opening, the dielectric layer is located on a substrate; epitaxially growing a germanium material within the at least one opening of the dielectric layer, the germanium material extending above a topmost surface of the dielectric layer; and planarizing the germanium material using at least one slurry composition to form coplanar surfaces of the germanium material and the dielectric layer, where a slurry composition of at least one slurry composition polishes the germanium material selective to the topmost surface of the dielectric layer, and includes an abrasive, at least one pH modulator, and an oxidizer, the at least one pH modulator including an acidic pH modulator, and lacking a basic pH modulator.

20 Claims, 13 Drawing Sheets

Related U.S. Application Data

(60) Provisional application No. 62/241,459, filed on Oct. 14, 2015.

(51) Int. Cl.
*H01L 21/306* (2006.01)
*H01L 21/02* (2006.01)
*C09K 3/14* (2006.01)

(58) Field of Classification Search
USPC .................................................... 438/679
See application file for complete search history.

(56) References Cited

U.S. PATENT DOCUMENTS

| | | | |
|---|---|---|---|
| 8,304,345 B2 | 11/2012 | Martinez et al. | |
| 8,338,301 B1 | 12/2012 | Han et al. | |
| 8,481,341 B2 | 7/2013 | Clark | |
| 8,969,204 B2 | 3/2015 | Kim et al. | |
| 8,981,427 B2 | 3/2015 | Hydrick et al. | |
| 9,029,908 B2 | 5/2015 | Lochtefeld | |
| 9,070,399 B2 | 6/2015 | Hamaguchi et al. | |
| 2005/0106848 A1 | 5/2005 | Bailey, III et al. | |
| 2007/0075041 A1 | 4/2007 | Ishibashi et al. | |
| 2008/0277378 A1 | 11/2008 | Babu et al. | |
| 2010/0012976 A1 | 1/2010 | Hydrick et al. | |
| 2010/0164106 A1 | 7/2010 | Lee et al. | |
| 2011/0221039 A1* | 9/2011 | Singh | C30B 25/186 257/615 |
| 2012/0199876 A1 | 8/2012 | Bai et al. | |
| 2013/0115721 A1 | 5/2013 | Clark | |
| 2013/0295752 A1* | 11/2013 | Huang | H01L 21/30625 438/500 |
| 2014/0170852 A1 | 6/2014 | Noller et al. | |
| 2014/0199841 A1 | 7/2014 | Noller et al. | |
| 2015/0099361 A1 | 4/2015 | Franz et al. | |
| 2015/0129795 A1 | 5/2015 | Hsu et al. | |
| 2015/0155181 A1 | 6/2015 | Wang et al. | |
| 2015/0175845 A1 | 6/2015 | Li et al. | |
| 2015/0184028 A1 | 7/2015 | Jung | |
| 2015/0206796 A1 | 7/2015 | Dasgupta et al. | |
| 2015/0380258 A1 | 12/2015 | Liu et al. | |

OTHER PUBLICATIONS

Waldron, N., et al., "Integration of InGaAs Channel n-MOS Devices on 200mm Si Wafers Using the Aspect-Ratio-Trapping Technique", ECS Transactions, Apr. 2012, pp. 115-128, 45, (4).

Peddeti, S., et al., "Chemical Mechanical Polishing of InP", ECS Journal of Solid State Science and Technology, Published Aug. 24, 2012, pp. P184-P189, 1 (4).

Mouton, A., et al., "Etching of InP by H3PO4, H2O2 Solutions", Japanese Journal of Applied Physics, Oct. 1990,pp. 1912-1913, vol. 29, No. 10.

Matovu, J. B., et al., "Use of Multifunctional Carboxylic Acids and Hydrogen Peroxide to Improve Surface Quality and Minimize Phosphine Evolution During Chemical Mechanical Polishing of Indium Phosphide Surfaces", Industrial & Engineering Chemistry Research, Publication Date (Web): Jul. 8, 2013, pp. 10664-10672, 52, (31).

Li, J. Z. et al., "Defect reduction of GaAs/Si epitaxy by aspect ratio trapping", Journal of Applied Physics, published online May 19, 2008, pp. 106102-1 to 106102-3, 103.

Iwai, H., "Roadmap for 22 nm and beyond (Invited Paper)", Microelectronic Engineering, Jul. 2009, pp. 1520-1528, vol. 86, Issue 7-9.

Fiorenza J. G., et al., "Aspect Ratio Trapping: A Unique Technology for Integrating Ge and III-Vs with Silicon CMOS", ECS Transactions, Oct. 2010, 33, (6), 963-976.

Dennard, R. H., et al., "Design of ion-implanted MOSFET's with very small physical dimensions", Proceedings of the IEEE, Apr. 1999, pp. 668-678, vol. 87, Issue 4.

Del Alamo, J. A., "Nanometre-scale electronics with III-V compound semiconductors", Nature, Nov. 17, 2011, pp. 317-323, vol. 479.

Chau, R., et al., "Integrated nanoelectronics for the future", Nature Materials, Nov. 2007, pp. 810-812, vol. 6.

Cai, Y., et al., "Chemical Mechanical Polishing of Selective Epitaxial Grown Germanium on Silicon", ECS Journal of Solid State Science and Technology, Published Nov. 7, 2013, pp. P5-P9, 3, (2).

Hydrick, J. M., et al., "Chemical Mechanical Polishing of Epitaxial Germanium on SiO2-patterned Si(001) Substrates", ECS Transactions, Oct. 2008, pp. 237-248, vol. 16, Issue 10.

Ong, P., et al., "Ge- and III/V-CMP for Integration of High Mobility Channel Materials", ECS Transactions, Mar. 2011, pp. 647-652, vol. 34, Issue 1.

Goley, P. S., et al., "Germanium Based Field-Effect Transistors: Challenges and Opportunities", Materials, Published: Mar. 19, 2014, pp. 2301-2339, 7, (3).

Lee, M. L., et al., "Strained Si, SiGe, and Ge channels for high-mobility metal-oxide-semiconductor field-effect transistors", Journal of Applied Physics, Published online Dec. 1994, pp. 011101-1 to 011101-27, 97, (1).

Currie, M. T., et al., "Controlling threading dislocation densities in Ge on Si using graded SiGe layers and chemical-mechanical polishing", Applied Physics Letters, Apr. 1998, pp. 1718-1720, vol. 72, No. 14.

Pillarisetty, R., "Academic and industry research progress in germanium nanodevices", Nature, Nov. 17, 2011, pp. 324-328, vol. 479.

Daix, N., et al., "Towards large size substrates for III-V co-integration made by direct wafer bonding on Si", APL Materials 2, published online Aug. 25, 2014, pp. 086104-1 to 086104-6.

List of IBM Patents or Patent Applications Treated as Related Dated Apr. 18, 2017, 2 Pages.

Office Action dated Jun. 13, 2017 received in U.S. Appl. No. 15/160,118.

* cited by examiner

GERMANIUM SMOOTHING AND CHEMICAL MECHANICAL PLANARIZATION PROCESSES

BACKGROUND

The present application relates to a semiconductor structure and a method for fabricating the same. More particularly, the present application relates to slurry compositions and methods for planarizing a germanium material for use, for instance, with fabrication of semiconductor structures, such as, p-type MOSFETs (PFET) devices.

As the density of semiconductor integrated circuits increases and the corresponding size of circuit elements decreases, one of the key strategies to increase performance at lower operating voltages is to increase carrier mobility in the channel region. By way of an example, the carrier mobility in the channel region may be enhanced, for instance, by employing non-silicon, high mobility charge carrier materials, such as, for example, germanium or a III-V compound semiconductor materials, in the fabrication of the channel region. For instance, germanium, a group IV semiconductor material which, for instance, has a highest hole mobility is utilized for fabrication of PFET devices.

The fabrication of germanium on a semiconductor substrate, such as, a silicon wafer, disadvantageously, leads to several issues such as, for instance, defect densities, owing to lattice mismatch of germanium and the silicon wafer. Aspect ratio trapping is one way to overcome the lattice mismatch which, for instance, includes trapping threading dislocations of the germanium material along the sidewalls of a dielectric layer disposed over the semiconductor substrate, such as, for instance, a silicon substrate. This results in a germanium material that has a lower region containing a first defect density and an upper region of a second defect density that is less than first defect density present in an aspect ratio trench. This upper region of the germanium material extends above the dielectric layer, and is subsequently planarized using one or more chemical mechanical planarization (CMP) processes. Prior art CMP processes tend to cause unwanted damage to the upper region of the germanium material.

Enhancements in CMP processing techniques and slurry compositions employed in such technology is continue to be desired for enhanced performance, while minimizing surface and sub-surface damage of the upper region of the germanium material.

SUMMARY

A method is disclosed in which a germanium material extending above a topmost surface of a dielectric layer present on a substrate is planarized to form coplanar surfaces of a remaining portion of the germanium material and the dielectric layer. The method includes epitaxial growth of a germanium material within one or more openings, i.e., trenches, of the dielectric layer. The epitaxially grown germanium material has a lower region having a first defect density, and an upper region having a second defect density that is less than the first defect density that is present in each opening. The upper region of the germanium material extends above the topmost surface of the dielectric layer. The upper region of the germanium material that extends above the openings is planarized using at least one slurry composition. In the present application, each slurry composition of the at least one slurry composition has a different removal rate selectivity towards the germanium material and the dielectric layer. In one embodiment, a slurry composition of the at least one slurry composition may include an abrasive, at least one pH modulator, and an oxidizer. In the slurry composition, the at least one pH modulator may include an acidic pH modulator, and it may lack a basic pH modulator. In such an example, the slurry composition has a rate of removal of the dielectric layer that is less than a rate of removal of the germanium material, and thus polishes the germanium material selective to the upper surface of the dielectric layer, thereby forming coplanar surfaces of a remaining portion of the germanium material and the dielectric layer. In another embodiment, an additional slurry composition of the at least one slurry composition may include an abrasive, at least one pH modulator and an oxidizer. In this embodiment, the at least one pH modulator may include at least one of an acidic pH modulator and a basic pH modulator. In such an example, the additional slurry composition has an enhanced germanium removal rate, and thus may reduce overburden and planarizes an initial topography of the germanium material, prior to the planarization of the germanium material with the slurry composition. This planarization process with the additional slurry composition may leave a planarized germanium material extending above the topmost surface of the dielectric layer, which can be removed using the slurry composition mentioned above.

In one embodiment, a method for fabricating a semiconductor structure is provided in which at least one opening is formed within a dielectric layer disposed above a substrate. A germanium material is epitaxially grown within the at least one opening of the dielectric layer, and above the topmost surface of the dielectric layer. The germanium material that is located above the topmost surface of the dielectric layer is planarized using at least one slurry composition to form coplanar surfaces of a remaining portion of the germanium material and the dielectric layer. The method, for instance, may further include a slurry composition of the at least one slurry composition that polishes the germanium material selective to the topmost surface of the dielectric layer, and may include an abrasive, at least one pH modulator, and an oxidizer, with the at least one pH modulator including an acidic pH modulator, but lacking a basic pH modulator.

In another aspect of the present application, a slurry composition for planarizing a germanium material is provided that includes a slurry composition including an abrasive, at least one pH modulator and an oxidizer. In such implementation, the at least one pH modulator includes at least one of an acidic pH modulator and a basic pH modulator.

In yet another aspect of the present application, a slurry composition for planarizing a germanium material is provided that includes a slurry composition including an abrasive, at least one pH modulator, and an oxidizer. In such implementation, the at least one pH modulator includes an acidic pH modulator, and lacks a basic pH modulator.

DETAILED DESCRIPTION

Figure 1:
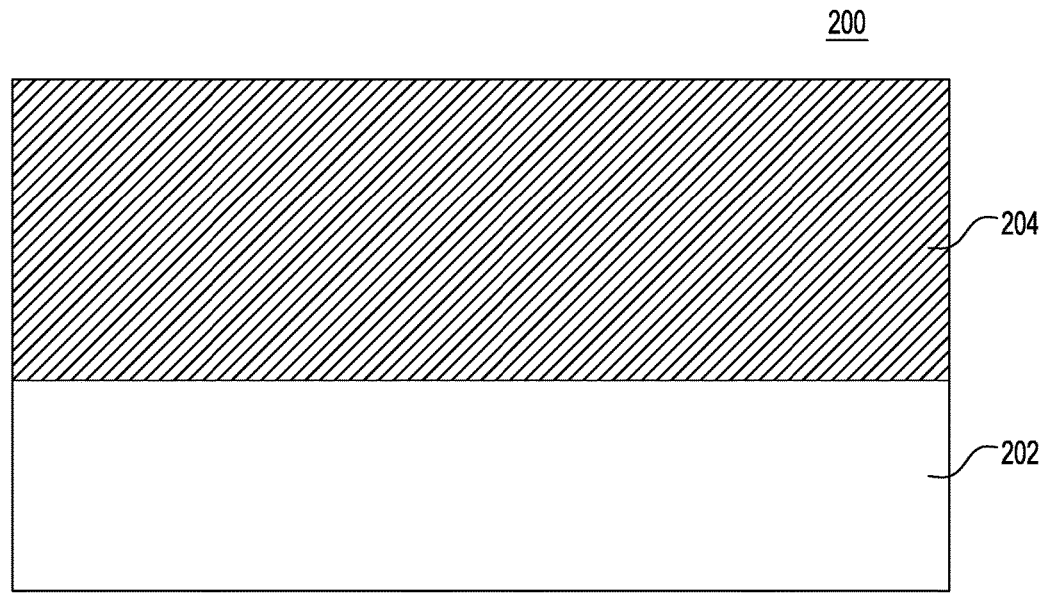
FIG. 1 is a cross-sectional view of one embodiment of a structure obtained during semiconductor structure fabrication, and includes a dielectric layer disposed over a substrate, in accordance with one or more aspects of the present application.

Aspects of the present application and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the present application in details. It should be understood, however, that the detailed description and the specific examples, while indicating embodiments of the present application, are given by way of illustration only, and not by way of limitation. Various substitutions, modifications, additions and/or arrangements within the spirit and/or scope of the underlying inventive concepts will be apparent to those skilled in the art from this application. Furthermore, reference is made below to the drawings, which are not drawn to scale for ease of understanding, wherein the same reference numbers used throughout different figures designate the same or similar components.

Integration of different semiconductor materials having different lattice constants is one challenging aspect of forming high performance devices of future technology nodes. Aspect ratio trapping (ART) is one way to overcome the lattice mismatch which, for instance, includes trapping threading dislocations of a semiconductor material, such as, for example, a germanium material, along the sidewalls of a dielectric layer disposed over a semiconductor substrate. In conventional ART processing, the aspect ratio trapping typically includes forming one or more openings, i.e., trenches, having an aspect ratio (opening depth to opening width) of 1:2 within the dielectric layer. A semiconductor material having a different lattice constant than the underlying semiconductor substrate is epitaxially grown from an exposed surface of the semiconductor substrate within the openings of the dielectric layer, and along the sidewalls of the dielectric layer. This, for instance, results in varying defect density regions of the semiconductor material being located within the openings. For example, a lower region of the semiconductor material within the opening may have a first defect density, and an upper region of the semiconductor material within the opening may have a second defect density that is less than the first defect density. The upper region of the semiconductor material extends above the dielectric layer. The present application provides an enhanced method for CMP processing of the upper region of a germanium material that extends above the dielectric layer.

In one embodiment of the present application, a process for facilitating chemical mechanical planarization of a germanium material is provided. The process includes first providing a dielectric layer having one or more openings formed therein and located on a substrate. Next, a germanium material is epitaxially grown within the one or more openings of the dielectric layer disposed over a substrate which, for instance, extends above the dielectric layer. A planarization process in accordance with the present application is then performed on an upper region of the germanium material that extends above the at least one or more openings and on the topmost surface of the dielectric layer. The planarization process may include, in one implementation, contacting the germanium material with a slurry composition that includes an abrasive, a pH modulator having an acidic pH modulator, but lacking a basic pH modulator, and an oxidizer. The planarization process results in forming a remaining portion of the germanium material that has a topmost surface that is coplanar with a topmost surface of the dielectric layer. The planarization process of the present application may, in some embodiment, also include planarizing the germanium material with an additional slurry composition, prior to the planarizing with the slurry composition, leaving a planarized germanium material extended above the dielectric layer. In some embodiments, a final surface cleaning may be performed to remove the remaining first and the second slurry particles and rinse off other chemicals.

By way of example, FIGS. 1-5 depict one embodiment of a method and one or more slurry composition(s) to planarize the germanium material that extend above the upper surface of the dielectric layer, and to form a remaining germanium material in which the topmost surface thereof is coplanar surface with a topmost surface of the dielectric layer, in accordance with one or more aspects of the present application.

Referring first to FIG. 1, there is illustrated a structure 200 that can be employed in accordance with an embodiment of the present application. The structure 200 may include a dielectric layer 204 disposed over, and located on, a substrate 202. As depicted, substrate 202 may be (in one example) a bulk semiconductor material such as, a bulk silicon wafer, having a first lattice constant. By way of example, the substrate may include a single crystalline silicon material with any suitable crystallographic orientation. For instance, the crystallographic orientation of the silicon substrate may be {100}, {110} or {111} orientations.

In another example, the substrate 202 may be any silicon-containing substrate including, but not limited to, silicon (Si), polycrystalline Si, amorphous Si or the like. Although not depicted in the figures, substrate 202 may further include a layered semiconductor structure such as, for example, silicon-on-nothing (SON), silicon-on-insulator (SOI), silicon germanium-on-insulator (SiGeOI), germanium-on-insulator (GOI), silicon-on replacement insulator (SRI) or the like. Substrate 202 may in addition or instead include various isolation structures or regions, nanowire structures, dopant regions and/or device features.

The dielectric layer 204, which is disposed on a surface of the substrate 202, may be, or include, a dielectric material, such as, for example, an oxide material, (e.g., silicon dioxide, tetraethyl orthosilicate (TEOS), a high density plasma (HDP) oxide, a low temperature oxide, a high aspect ratio process (HARP) oxide or the like), a nitride material (e.g., silicon nitride (SiN)) and/or an oxynitride material (e.g., silicon oxynitride ($SiO_xN_y$)). The dielectric layer 204 may be deposited using conventional deposition processes such as, for instance, chemical vapor deposition (CVD), plasma-enhanced chemical vapor deposition (PECVD), low-pressure chemical vapor deposition (LPCVD), or rapid thermal chemical vapor deposition (RTCVD). In one example, the dielectric layer 204 may have thickness within a range from 100 nm to 500 nm. Other thicknesses that are lesser than, or greater than the aforementioned thickness range may also be employed in the present as the thickness of the dielectric layer 204.

Figure 2A:
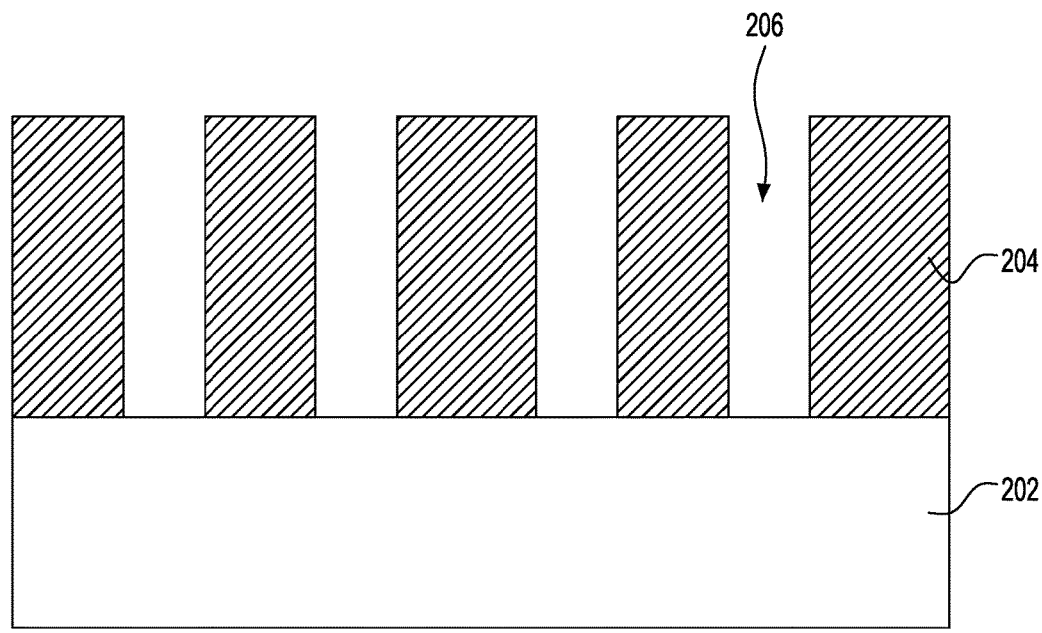
FIG. 2A depicts the structure of FIG. 1 after forming one or more openings within the dielectric layer, in accordance with one or more aspects of the present application.
Figure 2B:
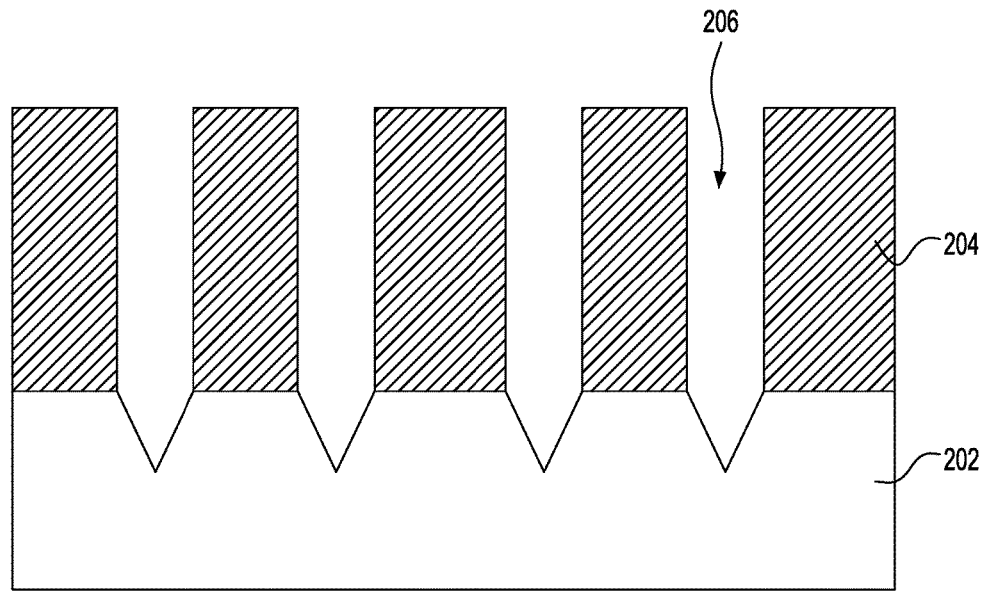
FIG. 2B depicts an alternative embodiment of the structure of FIG. 1 after forming one or more openings within the dielectric layer, in accordance with one or more aspects of the present application.

One or more patterning processes may be performed to form one or more openings 206 within the dielectric layer 204, as depicted in FIGS. 2A and 2B. As illustrated in FIG. 2A, the openings 206 extend down from a topmost surface of the dielectric layer 204 exposing a portion of the underlying substrate 202. In another embodiment in FIG. 2B, the opening 206 may extend below the surface of the substrate 202 creating a cavity within the substrate 202. The bottom wall of the cavity may be pointed (as shown) or planar (not shown).

In one embodiment, the patterning process used to define each opening 206 may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. After etching, the patterned photoresist can be removed utilizing any photoresist stripping process such as, for example, ashing.

In another embodiment, the patterning process used to define each opening 206 may include a sidewall image transfer (SIT) process. In yet another embodiment, the patterning process used to define each opening 206 may include a direct self-assembly (DSA) patterning process.

In an alternative embodiment of the present application, the exemplary semiconductor structure shown in FIG. 2A and FIG. 2B can be formed by first providing a plurality of semiconductor fins (not shown) extending upwards from a semiconductor substrate utilizing one of the above mentioned patterning processes. Next, a dielectric material that provides the dielectric layer 204 is formed between each semiconductor fin and thereafter a planarization process such as, for example, chemical mechanical polishing (CMP) may be employed. Each semiconductor fin is then removed utilizing an etch to form the openings 204. The etch may include hydrochloric (HCl) gas. A cavity as mentioned above can then be formed utilizing an etch such as, for example, a crystallographic etch.

Figure 3:
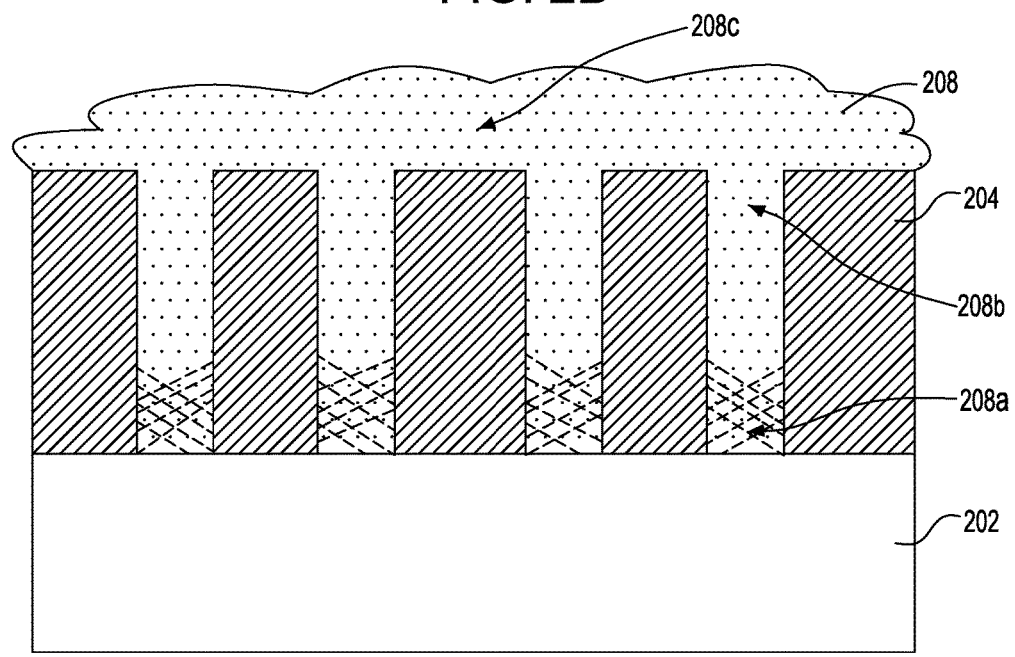
FIG. 3 depicts the structure of FIG. 2A after epitaxially growing a germanium material in each of the opening(s) which extends above an upper surface of the dielectric layer, in accordance with one or more aspects of the present application.

Referring now to FIG. 3, there is illustrated the structure of FIG. 2A after epitaxially growing a germanium material 208 in each of the openings 206. By way of example, the germanium material 208 can be epitaxially grown from an exposed portion of substrate 202 within the openings 206 using any suitable epitaxial deposition process such as, for instance, atmospheric pressure CVD (APCVD), low- (or reduced-) pressure CVD (LPCVD), ultra-high-vacuum CVD (UHCVD), by molecular beam epitaxy (MBE), metal-organic CVD (MOCVD) or by atomic layer deposition (ALD). In one embodiment, the germanium material 208 may be epitaxially grown using a germanium gas source, such as, for instance, germane ($GeH_4$), digermane ($Ge_2H_6$), halogermane, dichlorogermane, trichlorogermane, tetrachlorogermane, and combinations thereof. The epitaxial growth process of the germanium material 208 proceeds upwards from the exposed portion of the substrate 202 and extends above the topmost surface of the dielectric layer 204. As used herein, "epitaxially growing/growth" refers to the orderly growth of the germanium material over the exposed portion of the substrate 202, where the grown material arranges itself in the same crystal orientation as the underlying semiconductor material. The germanium material 208 has a lattice constant that is greater than the lattice constant of the substrate 202. The germanium material 208 has varying defect densities within the openings 206. For instance, and in one embodiment, the epitaxial growth process of the germanium material 208 can result in forming a lower region 208a having a first defect density and an upper region 208b having a second defect density, wherein the second defect density is less than the first defect density. In some embodiments of the present application, threading dislocations within the lower region 208a are trapped along the sidewalls of the dielectric layer 204 in a lower region of the openings 206. The epitaxial growth process further proceeds to form an overburden portion 208c that extends above the topmost surface of the dielectric layer 204. The defect density within the overburden portion of the germanium material 208 may be the same as, or less than, the second defect density. The thickness of the overburden portion 208c may be sufficient to allow subsequent planarization of the structure and, in one example, may be within a range from 100 nm to 5 μm.

Figure 4:
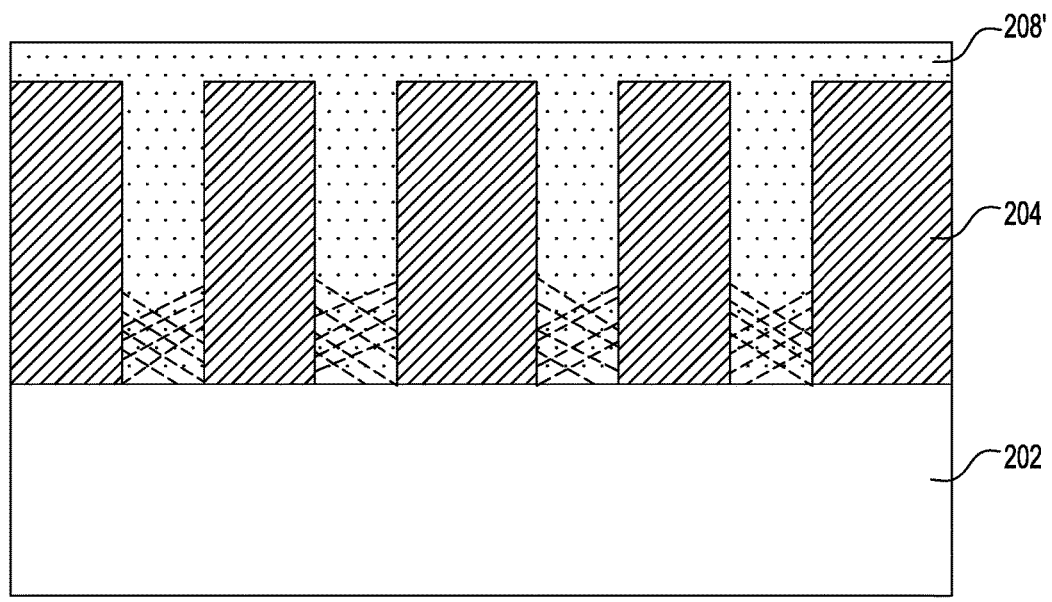
FIG. 4 depicts the structure of FIG. 3 with a planarized germanium material having been formed above the upper surface of the dielectric layer, in accordance with one or more aspects of the present application.

One or more chemical mechanical planarization processes may be employed to planarize the overburden portion 208c of the germanium material 208. By way of example, the CMP processing may be performed using, for instance, one or more slurry compositions, each slurry composition having different removal rate selectivity towards the germanium material 208 and the dielectric layer 204. As used herein, the first slurry composition refers to the additional slurry composition and the second slurry composition refers to the slurry composition described herein. In some embodiments, the CMP processing of the present application facilitates selectively planarizing the overburden portion 208c of the germanium material 208, without removing the upper region 208b and the lower region 208a of the germanium material 208 that is within the one or more openings 206. Further, the overburden portion 208c of the germanium material 208 may have an extremely rough surface, necessitating the first slurry composition to have an enhanced germanium removal rate so as to reduce the overburden of the germanium material 208 and planarize the initial topography, leaving, at least in part, a planarized germanium material 208' extended above the topmost surface of the dielectric layer 204, as depicted in FIG. 4. In one embodiment, the enhanced germanium removal rate of the first slurry composition may be within a range from 3000 Å/min to 5000 Å/min. In such an embodiment, and since the first slurry composition only reduces the overburden and planarizes the initial topography, without exposing the underlying dielectric layer 204, a removal rate selectivity of the slurry composition towards the germanium material 208 and the dielectric layer 204 may not be critical. In one example, a first slurry composition may be employed that is composed of, or includes, an abrasive material, one or more pH modulators, and an oxidizer. In one embodiment of the present application, the planarized germanium material 208' may have a thickness from 1000 Å to about 2500 Å.

By way of example, the abrasive particles of the first slurry composition may include one or more inorganic particles and/or organic particles. In one example, each abrasive particle may have an average particle diameter of from 5 nm to 500 nm, while in another embodiment, each abrasive particle may have an average particle diameter of from 10 nm to 200 nm, the average particle diameter is determined by conventional laser light scattering techniques. An appropriate polishing rate can be achieved, in some embodiments, using abrasive particles having an average particle diameter within the ranges mentioned above. The abrasive particles, in one embodiment, may be present in the first slurry composition in an amount from 0.1 to 30 percent by weight. In another embodiment, the abrasive particles may be present in the first slurry composition in an amount from 0.1 to 10 percent by weight. In one embodiment, the inorganic particles may include, for instance, silica, alumina, titania, zirconia, ceria, and the like. Examples of silica particles that may be employed include, but not limited to, fumed silica, silica synthesized by a sol-gel method, colloidal silica, or the like. In one example, the fumed silica may be obtained by reacting silicon chloride or the like, with oxygen and water in an aqueous phase. In another example, the silica synthesized by a sol-gel method may be obtained by hydrolysis and/or condensation of an alkoxysilicon compound which, for instance, may be used as a raw material. In yet another example, the colloidal silica may be obtained utilizing a conventional inorganic colloid method. In another embodiment, the organic particles may include, but are not limited to, polyvinyl chloride, a styrene (co)polymer, polyacetal, polyester, polyamide, polycarbonate, an olefin (co) polymer, a phenoxy resin, an acrylic (co)polymer, or the like. In one example, the olefin (co)polymer may include, for instance, polyethylene, polypropylene, poly-1-butene, poly-4-methyl-1-pentene, and the like. Examples of the acrylic (co)polymer include polymethyl methacrylate or the like. By way of example, the abrasive particles used in the first slurry composition can be selected, but not limited to, the examples of abrasive particles provided in Table 1:

TABLE 1

| Silica Abrasive * | Particle size (DLS diameter) | | Association Number |
|---|---|---|---|
| | Primary | Secondary | |
| SCM-030B | 46.3 nm | 74.7 nm | 1.61 |
| S32-X02 | 31.5 nm | 57.0 nm | 1.81 |
| SCM-020B | 15.4 nm | 42.1 nm | 2.73 |
| SCM-070B | 46.3 nm | 74.7 nm | 1.61 |
| S32-X04 | 46.4 nm | 54.5 nm | 1.17 |
| S32-X05 | 31.6 nm | 37.7 nm | 1.19 |
| S32-X08 | 31.1 nm | 109.9 nm | 3.53 |
| S32-X09 | 30.5 nm | 64.0 nm | 2.10 |
| S32-X10 | 37.4 nm | 82.1 nm | 2.20 |
| S32-X11 | 90.0 nm | 218.0 nm | 2.42 |
| S32-X12 | 13.3 nm | 54.5 nm | 4.10 |
| S32-X13 | 14.0 nm | 17.7 nm | 1.26 |
| S32-X16 | N/A | N/A | N/A |
| S32-X17 | 57.5 nm | 63.3 nm | 1.10 |
| S32-X18 | N/A | 80 nm | N/A |
| S32-X19 | N/A | N/A | N/A |
| S32-X20 | N/A | N/A | N/A |
| S32-X103 | 12 nm | 20 nm | 1.66 |
| S32-X104 | 22 nm | 35 nm | 1.59 |
| S32-X105 | 45 nm | 80 nm | 1.78 |
| S32-X106 | 13.3 nm | 54.5 nm | 4.10 |

* All the abrasive particles listed in Table 1 are supplied by JSR Corporation.

Continuing further with FIG. 4, the first slurry composition may include, in one embodiment, one or more acidic pH modulators, and one or more basic pH modulators, which may modulate the pH of the first slurry composition to be in a range from 1 to 12. In some embodiments, the pH range of the first slurry composition is from 2 to 10. In some embodiments, the acidic pH modulators of the first slurry composition may include an inorganic acid, while the basic pH modulators of the first slurry composition may include at least one of an organic base and an inorganic base. In one example, the organic base may include, but is not limited to, tetramethylammonium hydroxide, triethylamine, N-methylethanolamine, methylamine, triethanolamine or the like. In another example, the inorganic base may include, but is not limited to, ammonium hydroxide, potassium hydroxide, sodium hydroxide, or the like. In one embodiment of the present application, the inorganic base present in the first slurry composition is within a range of 0.0001 to 0.1 percent by weight. In yet another example, the inorganic acid may include, but is not limited to, nitric acid, sulfuric acid, phosphoric acid or the like. In one embodiment of the present invention, the inorganic acid present in the first slurry composition is within a range of 0.0001 to 0.1 percent by weight.

The oxidizer that is present in the first slurry composition may, in some embodiments, facilitate increasing the germanium removal rate of the overburden portion 208c of the germanium material 208 and also reduce the surface roughness of the resultant germanium material, subsequent to the planarization processes described herein. As described further below, the oxidizer present in the first and the second slurry compositions may facilitate achieving an atomically smooth surface of the germanium material that is coplanar with a topmost surface of the dielectric layer 204. In one example, the oxidizer includes, but is not limited to, ceric ammonium nitrate, ferric nitrate, sodium persulfate, potassium persulfate, hydrogen peroxide, potassium permanganate or the like. By way of an example, the oxidizer present in the first slurry composition may be within a range of 0.5 to 200 mL/L. In some embodiment, the range of the oxidizer that is present in the first slurry composition is from 0.1 to 100 mL/L.

Still further, the first slurry composition may include one or more of the following optional components: surfactants, additives, dispersants, polyelectrolytes, soluble polymers and molecules that adsorb onto the surface of the dielectric layer 204 which, for instance, may improve colloidal stability and may enhance shelf life of the first slurry composition. Additionally, the surfactants may also facilitate removal of the abrasive particles from the substrate surface during the CMP processing. In one example, the surfactant is an anionic surfactant which may include, for example, a surfactant containing at least one functional group selected from a carboxyl group (—COOX), a sulfonic acid group (—SO$_3$X), and a phosphate group (—HPO$_4$X) (wherein X represents hydrogen, ammonium, or a metal). In another example, the anionic surfactant may include, but is not limited to, aliphatic and aromatic sulfates and sulfonates, and a phosphate salt, or the like. Still further, the anionic surfactants may also include compounds such as, for instance, potassium dodecylbenzenesulfonate, ammonium dodecylbenzenesulfonate, sodium alkylnaphthalenesulphonate, alkyl sulfosuccinate, potassium alkenylsuccinate, or the like, as well as aliphatic soaps like potassium oleate or the like. The anionic surfactants may be used either individually or in combination. In another aspect, the surfactant is a nonionic surfactant which may include, but is limited to, a polyoxyethylene alkyl ether, an ethylene oxide-propylene oxide block copolymer, acetylene glycol, an ethylene oxide addition product of acetylene glycol, an acetylene alcohol, or the like. In another example, a nonionic polymer compound such as polyvinyl alcohol, cyclodextrin, polyvinyl methyl ether, or hydroxyethylcellulose may be used as the nonionic surfactant. In another embodiment, the surfactant is a cationic surfactant which may include, but is not limited to, an aliphatic amine salts, aliphatic ammonium salts, or the like. In addition, polyelectrolytes, such as, for instance, poly (acrylic acid) and their salts such as sodium, potassium and ammonium, polystyrene sulfonate, carboxymethyl cellulose, polyvinyl pyrrolidone and polyacrylamides can also be used and added during the polishing to control the selectivity. Other additives such as nitrogen compounds including triazoles, imines, amides and imides can also be used. In a specific example, the additives may include, but not limited to, benzotriazole, aminotriazole, guanidine hydrochloride, urea derivatives and thioureas.

By way of example, a general formulation of the first slurry composition having a pH within a range of 1 to 12, may include:

a) Abrasive particle, such as, silica in the range of 0.5 to 30 percent by weight, and more preferably, within a range of 0.1 to 10 percent by weight;

b) An acidic pH modulator within the range of about 0.0001 to 0.1 percent by weight;

c) A basic pH modulator within the range of 0.0001 to 0.1 percent by weight;

d) An oxidizer, such as, 30% solution of hydrogen peroxide within the range of 0.5 to 200 mL/L, and more preferably, within the range of 0.1 to 100 mL/L.

The following examples of the first slurry composition are provided to further describe the application, and should not be construed as in any way limiting the scope of the present application. The first slurry composition may be prepared by admixing various components, for example, abrasive particle, pH modulators, oxidizers, surfactants, additives, etc.

Example 1

A first slurry composition having a pH within a range of 2 to 6 was prepared that included:
a) abrasive particle such as, 5% by weight of colloidal silica abrasive dispersed in water;
b) an acidic pH modulator containing an inorganic acid, such as, for instance, phosphoric acid within a range of 0.0004 to 0.0006% by weight;
c) a basic pH modulator containing an inorganic base, such as, for instance, potassium hydroxide within a range of 0.0005 to 0.002% by weight; and
d) an oxidizer, such as, for instance, 30% solution of hydrogen peroxide of 5 mL/L.

Example 2

A first slurry composition having a pH within a range of 2 to 6 was prepared and included:
a) abrasive particle such as, 5% by weight of colloidal silica abrasive dispersed in water;
b) an acidic pH modulator containing an inorganic acid, such as, for instance, phosphoric acid within a range of 0.0004 to 0.0006% by weight;
c) a basic pH modulator containing an inorganic base, such as, for instance, potassium hydroxide within a range of 0.0005 to 0.002% by weight; and
d) an oxidizer, such as, for instance, 30% solution of hydrogen of 3 mL/L.

Example 3

A first slurry composition having a pH within a range of 2 to 6 was prepared and included:
a) abrasive particle such as, 1% by weight of colloidal silica abrasive dispersed in water;
b) an acidic pH modulator containing an inorganic acid, such as, for instance, phosphoric acid within a range of 0.0004 to 0.0006% by weight;
c) a basic pH modulator containing an inorganic base, such as, for instance, potassium hydroxide within a range of 0.0005 to 0.002% by weight; and
d) an oxidizer, such as, for instance, 30% solution of hydrogen peroxide within a range of 0.5 to 5 mL/L.

Example 4

A first slurry composition having a pH within a range of 6 to 11 was prepared and included:
a) abrasive particle such as, 5% by weight of colloidal silica abrasive dispersed in water;
b) an acidic pH modulator containing an inorganic acid, such as, for instance, phosphoric acid within a range of 0.0004 to 0.0006% by weight;
c) a basic pH modulator containing an inorganic base, such as, for instance, potassium hydroxide within a range of 0.0005 to 0.002% by weight; and
d) an oxidizer, such as, for instance, 30% solution of hydrogen peroxide within a range of 0.5 to 50 mL/L.

Figure 5:
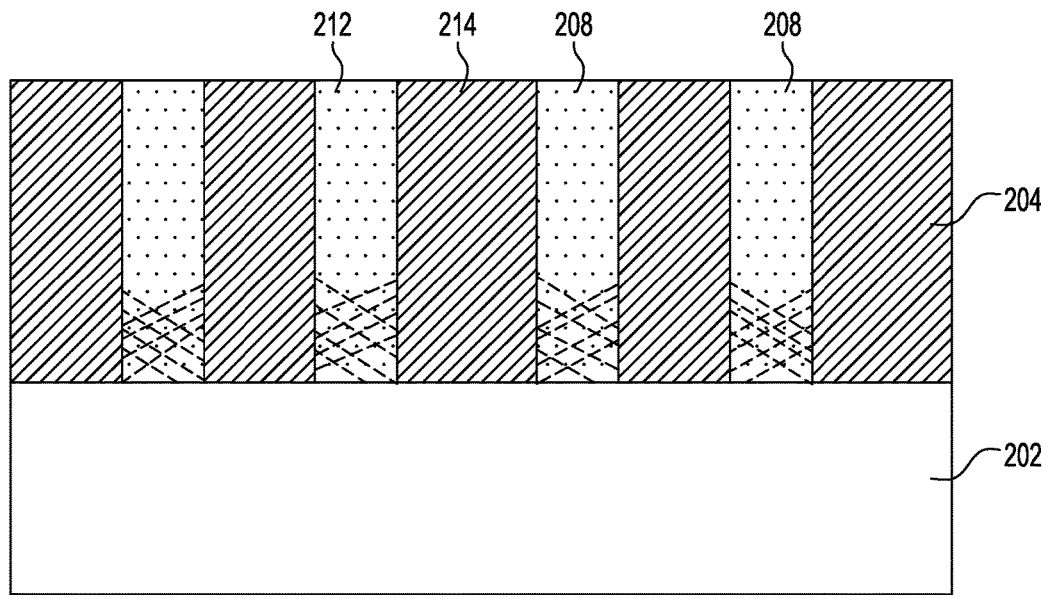
FIG. 5 depicts the structure of FIG. 4 after further planarizing the planarized germanium material to form coplanar upper surfaces of a remaining portion of the germanium material and the dielectric layer, in accordance with one or more aspects of the present application.

One or more chemical planarization steps may be extended using, for instance, a second slurry composition of the one or more slurry compositions to polish the remaining planarized germanium material 208' (see FIG. 4) that extends above the topmost surface of the dielectric layer 204, using (in one embodiment) the topmost surface of dielectric layer 204, as a polish stop. The result is that topmost surface 212 of the remaining portion of the germanium material 208 is coplanar with the topmost surface 214 of the dielectric layer 204, although height differences may exist locally, as depicted in FIG. 5. By way of example, the second slurry composition may include an abrasive particle, one or more pH modulators lacking a basic pH modulator, and an oxidizer. Such a second slurry composition may have a high germanium removal rate and a low dielectric material removal rate which, for instance, facilitates planarizing and/or polishing the planarized germanium material 208' (see FIG. 4), selective to the dielectric layer 204. In one example, the second slurry composition may have a germanium removal rate of 500 Å/min to about 1000 Å/min and a dielectric material removal rate of about 10 Å/min to about 50 Å/min. In some embodiments, such a second slurry composition may prevent any significant erosion of the dielectric layer 204 and may enable complete removal of any residual germanium extended above the topmost surface 214 of the dielectric layer 204. The second slurry composition has a rate of removal of dielectric materials (for instance, that provide the dielectric layer 204) lower than the rate of removal of the germanium material. In one embodiment, the second slurry composition may be polish-resistant to at least one dielectric material that provides the dielectric layer. As used herein, "polish-resistant" refers to the one or more dielectric materials, such as, oxide and/or nitride materials, that provide the dielectric layer being resistant to polishing and/or planarization processes described herein using the second slurry composition. In an embodiment, and when an initial topography of the overburden germanium material 208c that extends above the dielectric layer 204 is relatively small (for instance, within a range of about 1000 Å-1500 Å), the CMP processing may be accomplished using only the second slurry composition, thereby eliminating an additional CMP processing step using the first slurry composition. As depicted, the root mean square (RMS) roughness of the resultant remaining portion of the germanium material 208, having a coplanar topmost surface with the dielectric layer 204, upon CMP processing may be, in one embodiment, less than 0.5 nm. The remaining portion of the germanium material 208 has the upper region of the second defect density and the lower region of the first defect density; the overburden portion 208c has been removed. At this stage of the present application, and in some embodiments, the dielectric layer 204 may be partially recessed to expose an upper region of the germanium material 208, and a semiconductor device such as, a field effect transistor, can be formed on the exposed surface of the upper region of the germanium layer 208. In other embodiments, a semiconductor device may be formed directly upon the topmost surface of the remaining portion of the germanium material 208 shown in FIG. 5.

Further, in one embodiment, the CMP processing described herein with the first slurry composition and the second slurry composition may be accomplished using the same polishing pad. As one skilled in the art will understand, the first slurry composition and the second slurry composition can be sequentially utilized to form coplanar surfaces of the germanium material and the dielectric layer, and can be applied between the polishing pad and the structure. Still further, although not depicted in the figures, a final surface cleaning process is performed to remove any of the remaining first and the second slurry compositions and rinse off other chemicals, resulting in the resultant semiconductor structure.

By way of example, the abrasive particles of the second slurry composition may include, one or more inorganic particles and/or organic particles which may have a particle diameter that is equal to the particle diameter of the abrasive particles used in the first slurry composition, and may be selected from any of the abrasive particles employed in the first slurry composition, described above in connection with FIG. 4. As described above in connection with the first slurry composition, each abrasive particle may have an average particle diameter from 5 nm to 500 nm, or in a range from 10 nm to 200 nm. Further, the abrasive particle, in one embodiment, may be present in the second slurry composition in an amount of 0.1 to 30 percent by weight, or in a range of 0.1 to 10 percent by weight. In one embodiment, the abrasive particle of the second slurry composition may be different from the abrasive particle of the first slurry composition, while the chemistry of the first slurry composition and the second slurry composition may remain the same. In another embodiment, the abrasive particle of the second slurry composition may be the same as the abrasive particle of the first slurry composition, but the concentration of the abrasive particle of the second slurry composition may be different from the concentration of the abrasive particle of the first slurry composition. In yet another embodiment, the abrasive particle and the chemistry of the first slurry composition and the second slurry composition may be entirely different.

In one implementation, the pH modulator of the second slurry composition which includes an acidic pH modulator, but lacks a basic pH modulator, may modulate the pH of the second slurry composition to be 3 to 11. In one example, the pH modulator of the second slurry composition may be selected from any of the inorganic acids utilized for the first slurry composition, as described above in connection with FIG. 4. For instance, the inorganic acid may include, but is not limited to, nitric acid, sulfuric acid, phosphoric acid or the like. In one embodiment, the inorganic acid present in the second slurry composition is within a range of 0.0001 to 0.1 percent by weight. In another implementation, the oxidizer of the second slurry composition may be selected from any of the oxidizer materials of the first slurry composition, described above in connection with FIG. 4. In one example, the oxidizer present in the second slurry composition may be within a range of 0.5 to 200 mL/L, or in a range of 0.1 to 100 mL/L. Additionally, the second slurry composition may also include surfactants, additives, dispersants, polyelectrolytes, soluble polymers and molecules that adsorb onto the surface of the dielectric layers which, for instance, may improve colloidal stability and may enhance the shelf life of the second slurry composition. These materials of the second slurry composition may be similar or same as the materials utilized for first slurry composition, described above in connection with FIG. 4.

By way of example, a general formulation of the second slurry composition having a pH within a range of 3 to 11, may include:
a) abrasive particle, such as, silica in the range of about 0.5 to about 30 percent by weight, or within a range of 0.1 to 10 percent by weight;
b) an acidic pH modulator within the range of 0.0001 to 0.1 percent by weight; and
c) an oxidizer, such as, 30% solution of hydrogen peroxide within the range of 0.5 to 200 mL/L, or within a range of 0.1 to 100 mL/L.

The following examples of the second slurry composition are provided to further describe the invention, and should not be construed as in any way limiting the scope of the invention. The second slurry composition may be prepared by admixing various components, for example, abrasive particles, pH modulators, oxidizers, surfactants, additives, etc.

Example 1

The second slurry composition having a pH within a range of 3 to 5 was prepared that included:
a) abrasive particle such as, 5% by weight of colloidal silica abrasive dispersed in water;
b) an acidic pH modulator, such as, for instance, phosphoric acid within a range of 0.0004 to about 0.0006% by weight; and
c) an oxidizer, such as, for instance, 30% solution of hydrogen peroxide of 2 mL/L.

Example 2

The second slurry composition having a pH within a range of 3 to 5 was prepared and included:
a) abrasive particle such as, 1% by weight of colloidal silica abrasive dispersed in water;
b) an acidic pH modulator, such as, for instance, phosphoric acid within a range of 0.0004 to 0.0006% by weight; and
c) an oxidizer, such as, for instance, 30% solution of hydrogen peroxide of 1 mL/L.

Example 3

The second slurry composition having a pH within a range of 3 to 5 was prepared and included:
a) abrasive particle such as, 1% by weight of colloidal silica abrasive dispersed in water;
b) an acidic pH modulator, such as, for instance, phosphoric acid within a range of 0.0004 to 0.0006% by weight; and
c) an oxidizer, such as, for instance, 30% solution of hydrogen peroxide within a range of 1 to 5 mL/L
d) polyelectrolyte, such as, for instance, polystyrene sulfonate (having a molecular weight of 10,000 to 400,000) within a range of 0.01 to 0.1 percent by weight.

Example 4

The second slurry composition having a pH within a range of 3 to 5 was prepared and included:
a) abrasive particle such as, 1% by weight of colloidal silica abrasive dispersed in water;
b) an acidic pH modulator, such as, for instance, phosphoric acid within a range of 0.0004 to 0.0006% by weight;
c) an oxidizer, such as, for instance, 30% solution of hydrogen peroxide within a range of 2.5 to 10 mL/L;
d) polyelectrolyte, such as, for instance, poly(acrylic acid) (having a molecular weight of 400,000) within a range of 0.01 to 0.1 percent by weight.

By way of further clarification, FIGS. 6-12 illustrate representative examples of experimental data of the first and the second slurry compositions described herein to form coplanar surfaces of the germanium material and the dielectric layer, in accordance with one or more aspects of the present application. The following representative examples of the experimental data of the first and the second slurry compositions should not be construed as in any way limiting the scope of the application.

Figure 6:
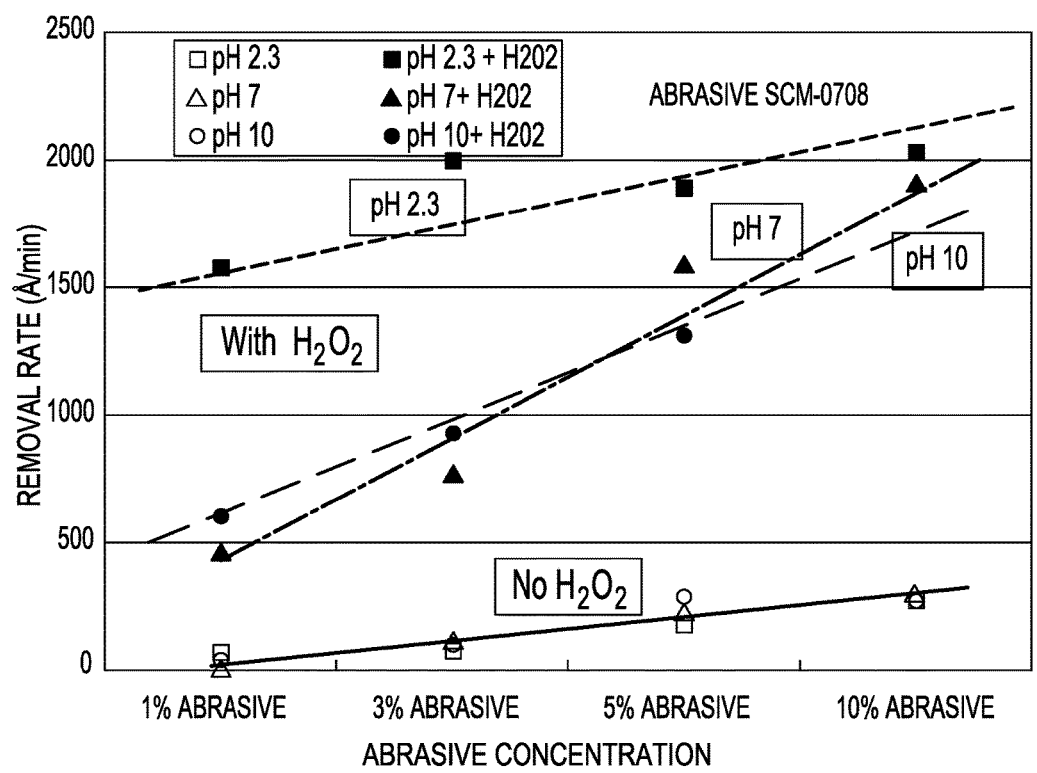
FIG. 6 depicts a representative example of the first and the second slurry compositions utilized in the forming of the coplanar surfaces of the germanium material and the dielectric layer, and illustrates the rate of removal of the germanium material as a function of concentration of abrasive particles, in accordance with one or more aspects of the present application.
Figure 7:
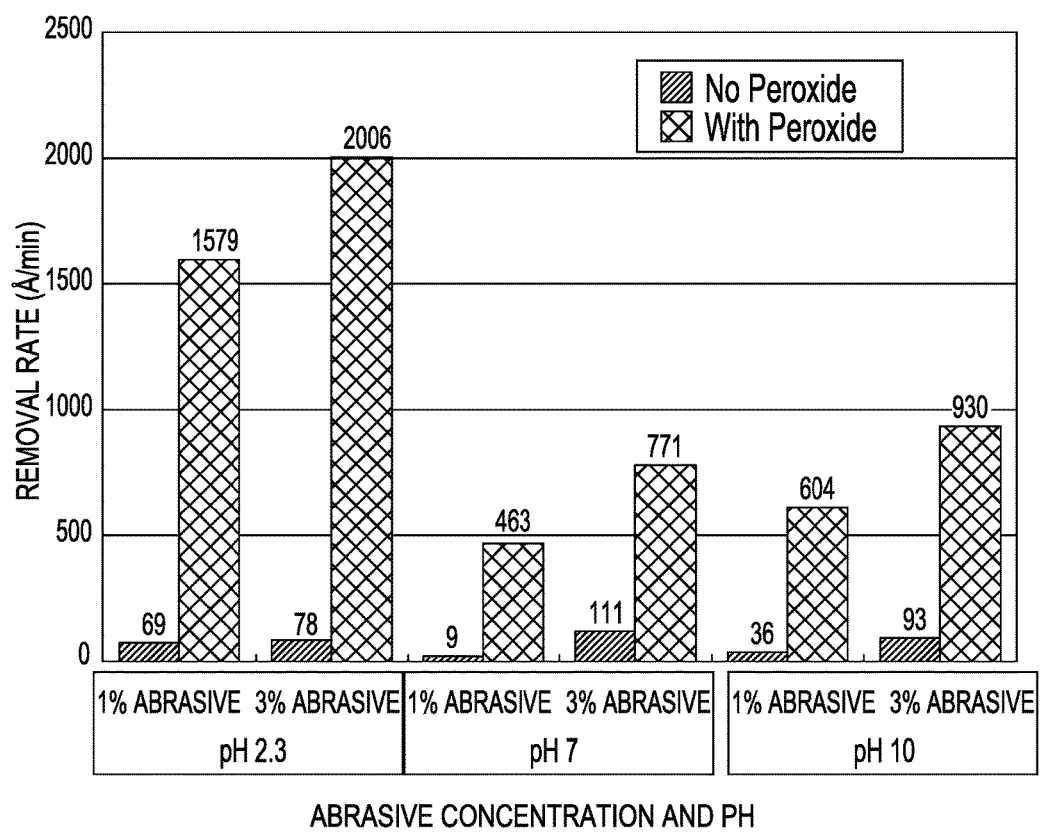
FIG. 7 depicts a representative example of the first and the second slurry compositions utilized in the forming of the coplanar surfaces of the germanium material and the dielectric layer, and illustrates the presence of the oxidizer enhancing the rate of removal of the germanium material, in accordance with one or more aspects of the present application.
Figure 8:
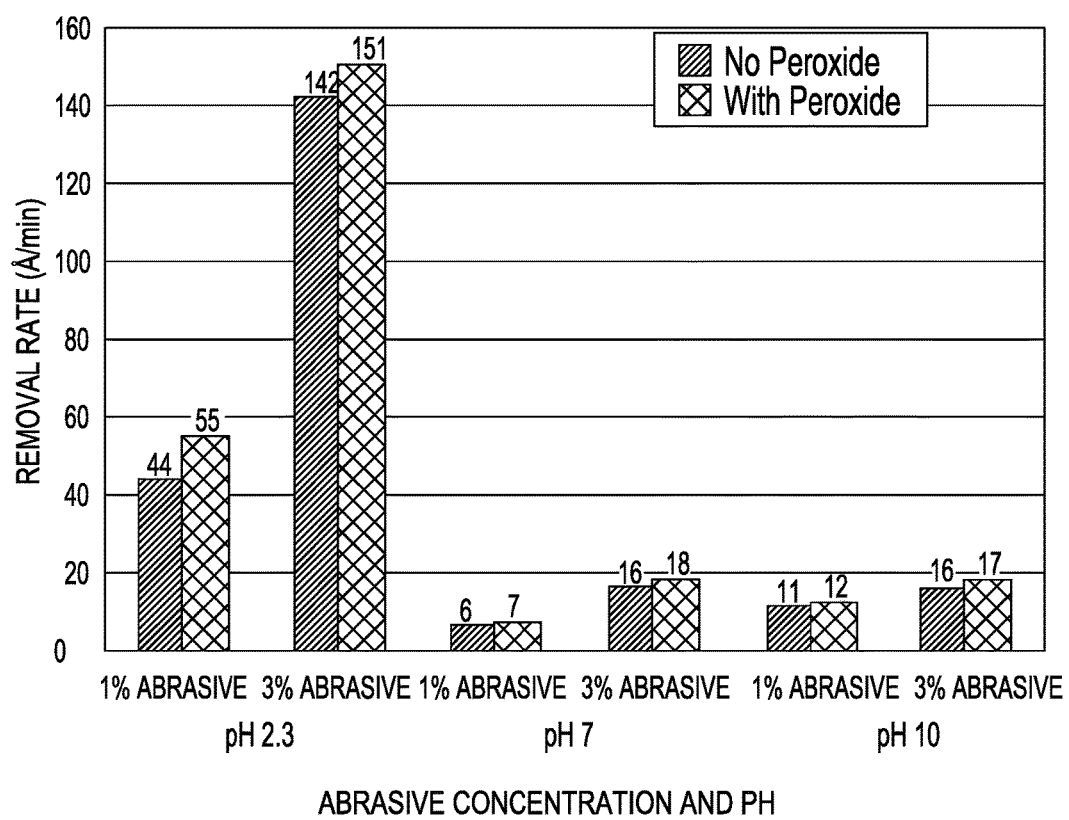
FIG. 8 depicts a representative example of the first and the second slurry compositions utilized in the forming of the coplanar surfaces of the germanium material and the dielectric layer, and illustrates the rate of removal of dielectric material as a function of concentration of abrasive particles at various pH values, in accordance with one or more aspects of the present application.
Figure 9:
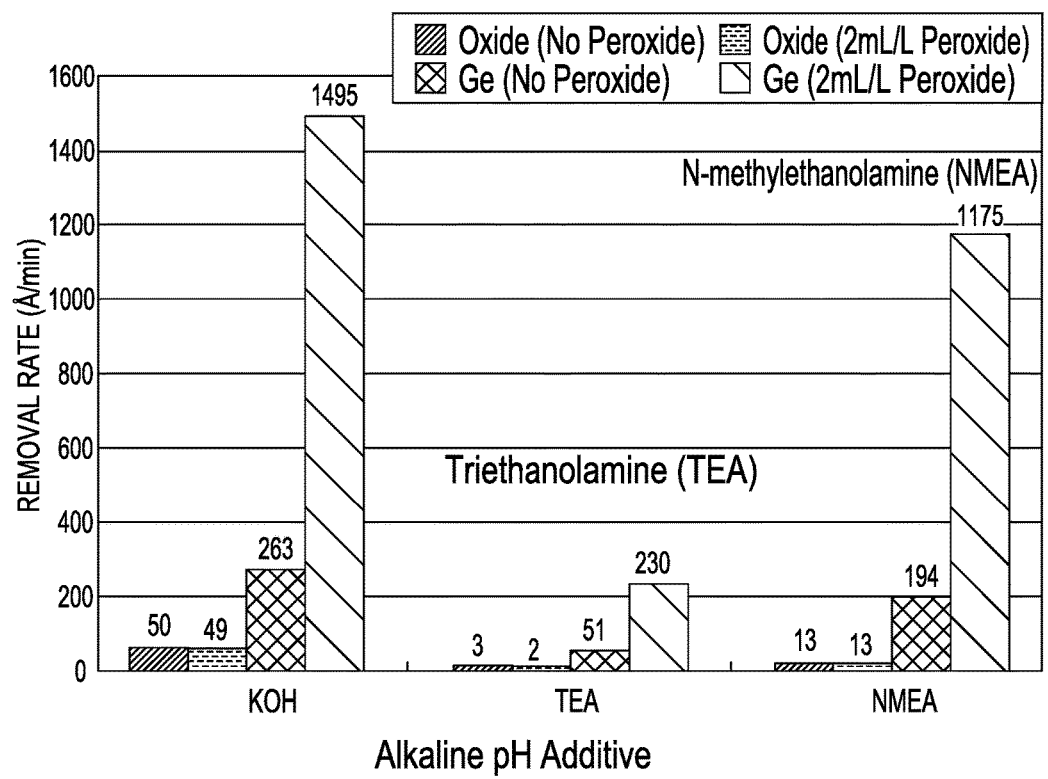
FIG. 9 depicts a representative example of the first and the second slurry compositions utilized in the forming of the coplanar surfaces of the germanium material and the dielectric layer, and illustrates the effect of various pH modulators on rate of removal of the germanium material and the dielectric material, in accordance with one or more aspects of the present application.

Notably, FIGS. 6-7 depict comparative examples of the rate of removal of the germanium material as a function of concentration of abrasive particles at various pH values of the slurry compositions described herein, in accordance with one or more aspects of the present application. As evident from FIGS. 6 and 7, the rate of removal of the germanium material increases with an increase in concentration of the abrasive particles with the addition of oxidizer, such as, hydrogen peroxide, and that the presence of the oxidizer, such as, for example, hydrogen peroxide in the first and the second slurry composition provides an enhanced rate of removal of the germanium material. Further, as depicted in FIG. 8, the rate of removal of the dielectric material, such as, for instance, oxide material, is a function of concentration of abrasive particles at various pH values with the addition of the oxidizer, for instance, hydrogen peroxide. In one implementation, FIG. 9 depicts the effect of various pH modulators on the rates of removal of the germanium material and the dielectric material, such as, for instance, oxide material. For instance, FIG. 9 depicts one example of the rates of removal of the germanium material and the oxide material using the first and the second slurry compositions having 5% by weight of the abrasive particle (e.g., SCM070B, as supplied by JSR Corporation) at pH value of 10.

Figure 10:
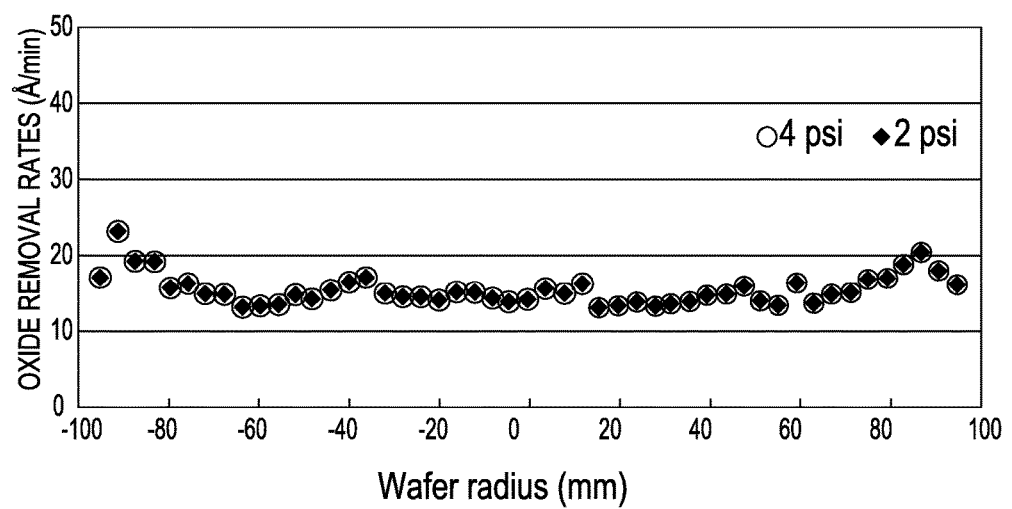
FIG. 10 depicts a representative example of the first and the second slurry compositions utilized in the forming of the coplanar surfaces of the germanium material and the dielectric layer, and illustrates the rate of removal of the dielectric material and uniformity across the wafer, in accordance with one or more aspects of the present application.
Figure 11:
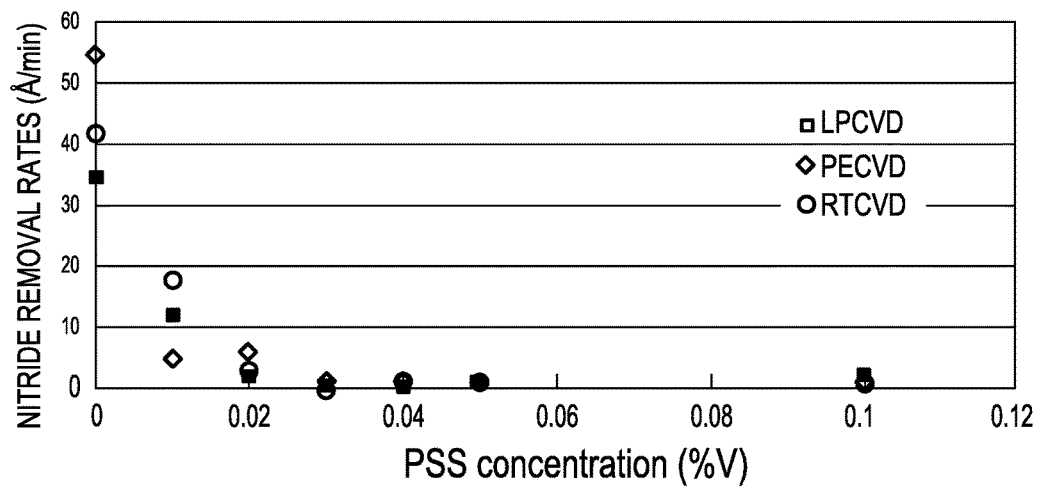
FIG. 11 depicts a representative example of the first and the second slurry compositions utilized in the forming of the coplanar surfaces of the germanium material and the dielectric layer, and illustrates that polystyrene sulfonate reduces the rate of removal of the dielectric material, in accordance with one or more aspects of the present application.
Figure 12:
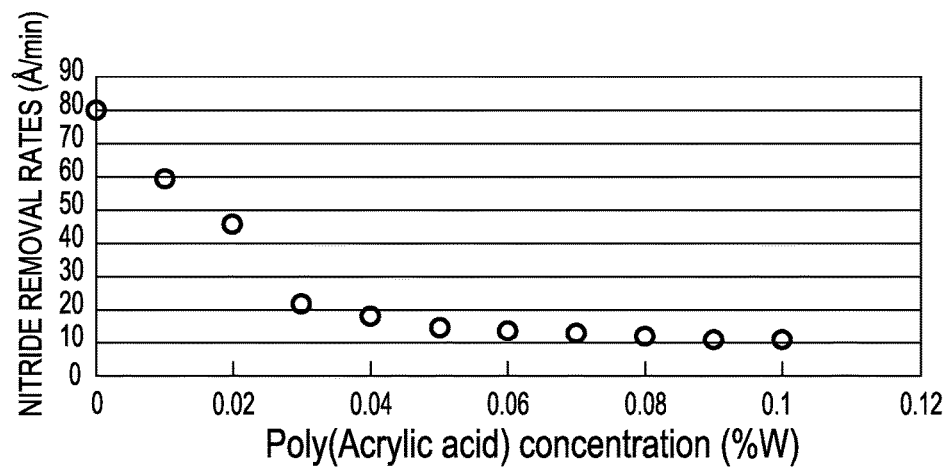
FIG. 12 depicts a representative example of the first and the second slurry compositions utilized in the forming of the coplanar surfaces of the germanium material and the dielectric layer, and illustrates that poly(acrylic acid) reduces the rate of removal of the dielectric material, in accordance with one or more aspects of the present application.

By way of further explanation, FIG. 10 illustrates the rate of removal of dielectric material, such as, for instance, oxide material, and uniformity of the dielectric layer across the wafer (for example, having a diameter of 200 mm) at various applied pressure, and as depicted, the rate of removal of the dielectric material is uniformly low resulting in coplanar surfaces of the dielectric layer and the germanium material. Still further, FIGS. 11 and 12 illustrate comparative examples of a relation between the rate of removal of the dielectric material and the concentration of water soluble polymers, such as, polyelectrolytes (e.g., polystyrene sulfonate (see FIG. 12), and poly(acrylic acid) (see FIG. 13)), and as evident, illustrates that the polystyrene sulfonate and poly(acrylic acid) reduces the rate of removal of the dielectric layer having, for instance, nitride material and, for instance, may serve to act as stop layers.

By way of example, and in one implementation, the RMS roughness of the resultant germanium material 208, upon CMP processing using the first and the second slurry compositions described herein is less than 0.5 nm, as evident by the examples provided in Table 2. For instance, Table 2 illustrates RMS roughness of the resultant germanium material 208 prior to and subsequent to the planarization processes described herein using the first and the second slurry compositions (for instance, having an abrasive particle (e.g., SCM-070B, as supplied by JSR Corporation)) at various pH values measured in the presence of oxidizers (e.g., hydrogen peroxide) and in the absence of the oxidizers, and that the addition of oxidizer such as, hydrogen peroxide facilitates achieving atomically smooth surface of the germanium material, subsequent to the CMP processes described herein.

TABLE 2

| | Ge RMS roughness (nm) | | |
|---|---|---|---|
| | Before | After CMP | |
| pH | CMP | No $H_2O_2$ | With $H_2O_2$ |
| Slurry: SCM-070B 1% (W) * | | | |
| 2.3 | 1.4 | 2.2 | 0.3 |
| 7 | 1.4 | 0.6 | 0.3 |
| 10 | 1.4 | 0.6 | 0.4 |

TABLE 2-continued

| | Ge RMS roughness (nm) | | |
|---|---|---|---|
| | Before | After CMP | |
| pH | CMP | No $H_2O_2$ | With $H_2O_2$ |
| Slurry: SCM-070B 3% (W)* | | | |
| 2.3 | 1.4 | 2.4 | 0.3 |
| 7 | 1.4 | 0.8 | 0.3 |
| 10 | 1.4 | 0.8 | 0.3 |

*The abrasive particles listed in Table 2 are supplied by JSR Corporation.

Still further, Tables 3-5 illustrate various examples of the RMS roughness of the germanium material 208 and the dielectric layer 204, prior to and subsequent to the planarization processes described herein, using various pH modulators. For instance, Table 3 illustrates one example of the RMS roughness of the germanium material prior to and subsequent to the planarization processes described herein with various pH modulators.

TABLE 3

| Slurry: SCM-070B 3% (W) pH 10* | | | |
|---|---|---|---|
| | Ge RMS roughness (nm) | | |
| | Before | After CMP | |
| pH adjuster | CMP | No $H_2O_2$ | With $H_2O_2$ |
| KOH | 1.5 | 1 | 0.3 |
| TEA | 1.5 | 0.7 | 0.5 |
| NMEA | 1.5 | 0.4 | 0.3 |

*The abrasive particle listed in Table 3 is supplied by JSR Corporation.

Table 4 illustrates another example of a relationship between the rate of removal of the germanium material and the RMS roughness of the germanium material with the abrasive particle (e.g., S32-X08, as supplied by JSR Corporation), at various pH values in the presence of oxidizer, such as, for instance, hydrogen peroxide.

TABLE 4

| | Ge removal rates and RMS surface roughness values for the abrasive S32-X08* | | |
|---|---|---|---|
| | | RMS roughness (nm) | |
| | Ge removal rate | Before | After |
| # Slurry | (Å/min) | CMP | CMP |
| 1 S32-X08 1% (W) pH~4.3 (unadjusted) + 1 mL/L $H_2O_2$ | 484 | 1.4 | 0.24 |
| 2 S32-X08 2% (W) pH~4.3 (unadjusted) + 1 mL/L $H_2O_2$ | 679 | 1.4 | 0.22 |
| 3 S32-X08 1% (W) pH 4 (Phosphoric acid) + 1 mL/L $H_2O_2$ | 598 | 1.5 | 0.16 |
| 4 S32-X08 2% (W) pH 4 (Phosphoric acid) + 1 mL/L $H_2O_2$ | 614 | 1.4 | 0.2 |
| 5 S32-X08 1% (W) pH 4 (Acetic acid) + 1 mL/L $H_2O_2$ | 538 | 1.6 | 0.17 |
| 6 S32-X08 2% (W) pH 4 (Acetic acid) + 1 mL/L $H_2O_2$ | 666 | 1.3 | 0.2 |
| 7 S32-X08 1% (W) pH 6 (KOH) + 1 mL/L $H_2O_2$ | 419 | 1.5 | 0.16 |

TABLE 4-continued

Ge removal rates and RMS surface roughness values for the abrasive S32-X08*

| # | Slurry | Ge removal rate (Å/min) | RMS roughness (nm) Before CMP | RMS roughness (nm) After CMP |
|---|---|---|---|---|
| 8 | S32-X08 2% (W) pH 6 (KOH) + 1 mL/L $H_2O_2$ | 575 | 1.4 | 0.2 |

*All the abrasive particles listed in Table 4 are supplied by JSR Corporation.

Table 5 illustrates yet another example of a relationship between the rate of removal of the germanium material and the dielectric oxide material (e.g., oxide material) and RMS roughness value for the abrasive particles, such as, S32-X04 and S32-X05 (as supplied by JSR Corporation).

TABLE 5

Ge, oxide removal rates and RMS surface roughness values*

| Slurry | Removal rates (Å/min) Ge | Removal rates (Å/min) Oxide | RMS roughness (nm) Before CMP | RMS roughness (nm) After CMP |
|---|---|---|---|---|
| S32-X04 1% (W) pH 8 + 1 mL/L $H_2O_2$ | 360 | 6 | 1.33 | 0.23 |
| S32-X05 1% (W) pH 8 + 1 mL/L $H_2O_2$ | 390 | 8 | 1.33 | 0.18 |

*All abrasive particles listed in Table 5 are supplied by JSR Corporation.

Figure 13:
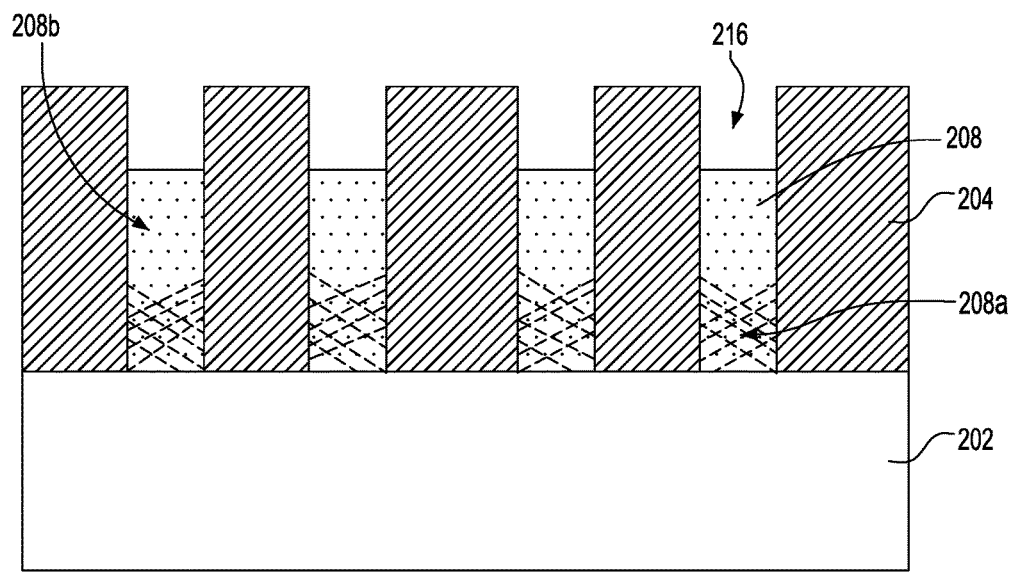
FIG. 13 depicts an alternative embodiment of the structure of FIG. 5 with the germanium material having been partially etched to forming one or more cavities, in accordance with one or more aspects of the present application.

Referring now to FIG. 13, there is illustrated an alternative embodiment of the structure of FIG. 5 with the germanium material 208 having been partially etched to form one or more cavities 216 within the dielectric layer 204, in accordance with one or more aspects of the present application. By way of example, the germanium material may be partially etched using any conventional anisotropic dry etching processes, such as, reactive ion etching, or conventional isotropic etching processes, such as, wet etch processes. In one example, the germanium material 208 may be recessed to a depth of 100 nm to 200 nm. As depicted, the germanium material 208 being etched includes, at least in part, the upper region 208b having the second defect density and the lower region 208a having the first defect density.

Figure 14:
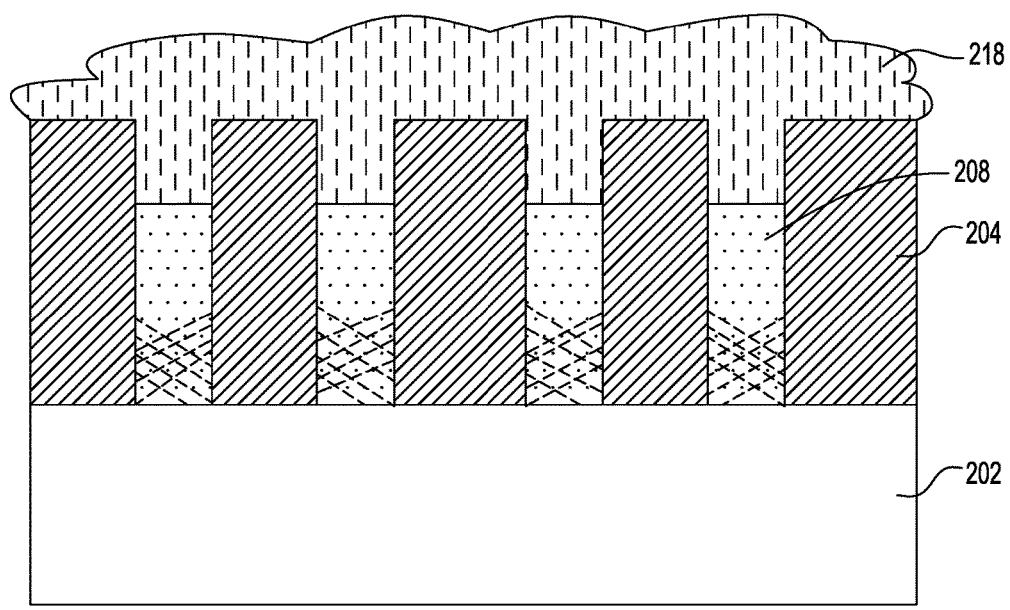
FIG. 14 depicts the structure of FIG. 13 after epitaxially growing an additional semiconductor material within the one or more cavities which, for instance, extends above the upper surface of the dielectric layer, in accordance with one or more aspects of the present application.

Referring now to FIG. 14, there is illustrated the structure of FIG. 13 after epitaxially growing an additional semiconductor material 218 within the one or more cavities 216 which extends above the topmost surface of the dielectric layer 204. The additional semiconductor material 218, in one example, may include, or be fabricated of, a semiconductor material, such as, silicon germanium, or a III-V compound semiconductor material such as, InSb, GaP, GaN, GaSb, InGaAs, InP, InAs, GaAs, etc., having a lattice constant that is substantially similar or very close to the lattice constant of the germanium material 208. The additional semiconductor material 218 may be formed by an epitaxial growth process such as described herein in the forming of the germanium material 208. In one example, the additional semiconductor material 218, such as, silicon germanium material, may be epitaxially grown using a silicon source gas, such as, for instance, silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexmethyldisilane, and combinations thereof, and the germanium source gas, such as, for instance, germane, digermane, halogermane, dichlorogermane, trichlorogermane, tetrachlorogermane and combinations thereof. As described above, the additional semiconductor material 218 may have substantially similar crystalline characteristics as the germanium material 208 disposed within the openings 206. In one embodiment, the thickness of the additional semiconductor material 218 that extends above the topmost surface of the dielectric layer 204 may be sufficient to allow subsequent planarization of the structure. In some embodiments, the additional semiconductor material 218 may be used to form the channel regions of III-V compound semiconductor material transistor devices such as, planar CMOS Field Effect Transistor (FETs) or non-planar FinFET devices to be formed, during subsequent fabrication processing.

Figure 15:
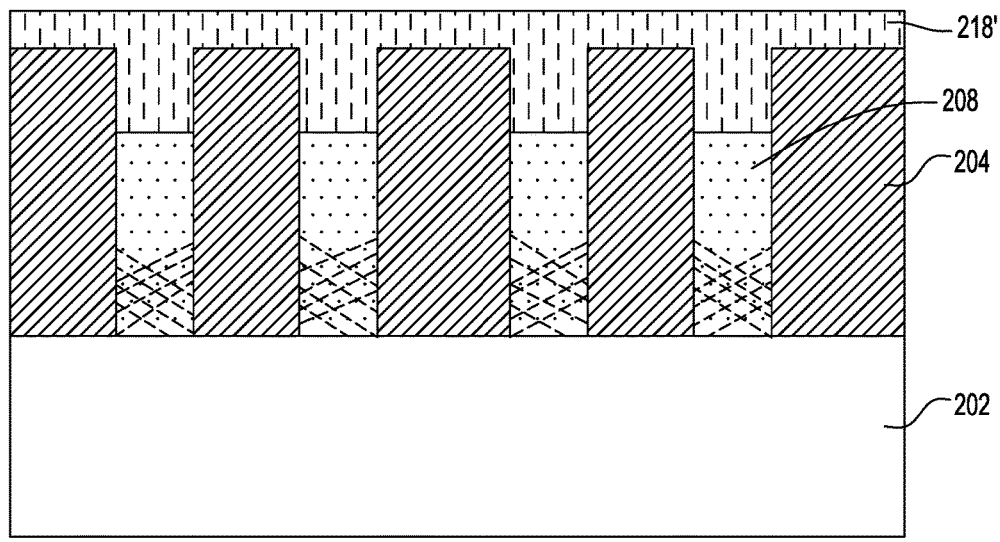
FIG. 15 depicts the structure of FIG. 14 with a planarized additional semiconductor material having been formed above the upper surface of the dielectric layer, in accordance with one or more aspects of the present application.

One or more chemical mechanical planarization steps may be employed to planarize the overburden additional semiconductor material 218 that extends above the topmost surface of the dielectric layer 204, while the germanium material 208 disposed within the openings 206 remains unaffected. By way of example, the CMP processing may be accomplished using, for instance, the first and the second slurry compositions described above in connection with FIGS. 4 and 5. For instance, the overburden additional semiconductor material 218 that extends above the topmost surface of the dielectric layer 204 may have an extremely rough surface which, for instance, may be planarized using the first slurry composition so as to reduce the overburden and to planarize the initial topography, leaving a planarized additional semiconductor material 218' extended above the upper surface of the dielectric layer 204, as depicted in FIG. 15. Further, since the first slurry composition only reduces the overburden and planarizes the initial topography, without exposing the underlying dielectric layer, a removal rate selectivity of the slurry composition towards the additional semiconductor material and the dielectric layer may not be critical. As described in previous embodiment, the first slurry composition may include an abrasive material, one or more pH modulators having an acidic pH modulator and a basic pH modulator, and an oxidizer.

By way of example, the abrasive particles of the first slurry composition may include one or more inorganic particles and/or organic particles which may have a particle diameter that is equal to the particle diameter of the abrasive particle used in the first slurry composition, and may be selected from any of the abrasive particles employed in the first slurry composition, described above in connection with FIG. 4. In one implementation, the pH modulator of the first slurry composition which, for instance, includes an acidic pH modulator and a basic pH modulator, may modulate the pH of the first slurry composition to be about 3 to about 11. In one example, the pH modulators of the first slurry composition may be selected from any of the pH modulators utilized for the first slurry composition, as described above in connection with FIG. 4. In one implementation of the present application, the oxidizer of the first slurry composition may be selected from any of the oxidizer materials of the first slurry composition, described above in connection with FIG. 4. Additionally, the first slurry composition may also include surfactants, additives, dispersants, polyelectrolytes, soluble polymers and molecules that adsorb on to the surface of the dielectric layers which, for instance, improve colloidal stability and enhance the shelf life of the first slurry composition. These materials of the first slurry composition may be similar or same as the materials utilized for first slurry composition, described above in connection with FIG. 4.

Figure 16:
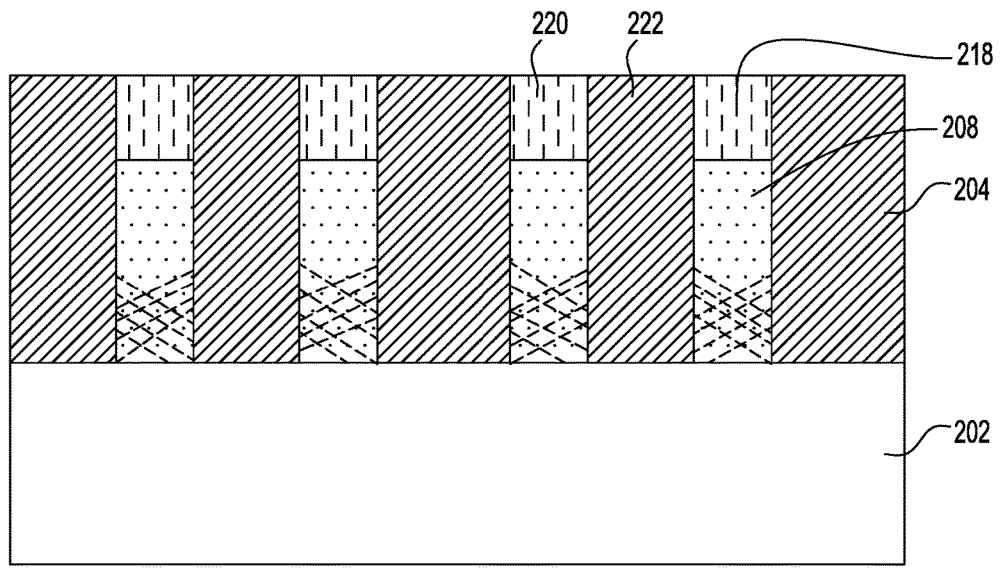
FIG. 16 depicts a resultant structure of FIG. 15 after planarizing the additional semiconductor material to form coplanar upper surfaces of the additional semiconductor material and the dielectric layer, in accordance with one or more aspects of the present application.

One or more chemical mechanical planarization processing may be extended using, for instance, the second slurry composition of the one or more slurry compositions to polish the remaining planarized additional semiconductor material 218' that extends above the dielectric layer 204, using the topmost surface of the dielectric layer 204, as a polish stop. The result is that topmost surface 220 of the additional semiconductor material 218 is substantially coplanar with the topmost surface 222 of the dielectric layer 204, as depicted in FIG. 16. As described in the previous embodiment, the second slurry composition may include, for instance, an abrasive particle, one or more pH modulators lacking a basic pH modulator, and an oxidizer, along with the surfactants, additives, dispersants, polyelectrolytes described herein in the second slurry composition utilized in the planarization of the germanium material, and the various materials of the second slurry composition may be substantially similar or the same materials of the second slurry composition described above in connection with FIG. 5. Further, as described above in the previous embodiment, the second slurry composition has a high additional semiconductor material removal rate and a low dielectric removal rate which, for instance, facilitates planarizing and/or polishing the planarized additional semiconductor material, selective to the dielectric layer. This, for instance, may prevent any significant erosion of the dielectric layer and may enable complete removal of any residual additional semiconductor material 218 extended above the upper surface 222 of the dielectric layer 204. Further, although not depicted in the figures, a final surface cleaning process is performed to remove any of the remaining first and the second slurry compositions and rinse off other chemicals, resulting in the resultant semiconductor structure.

Figure 17:
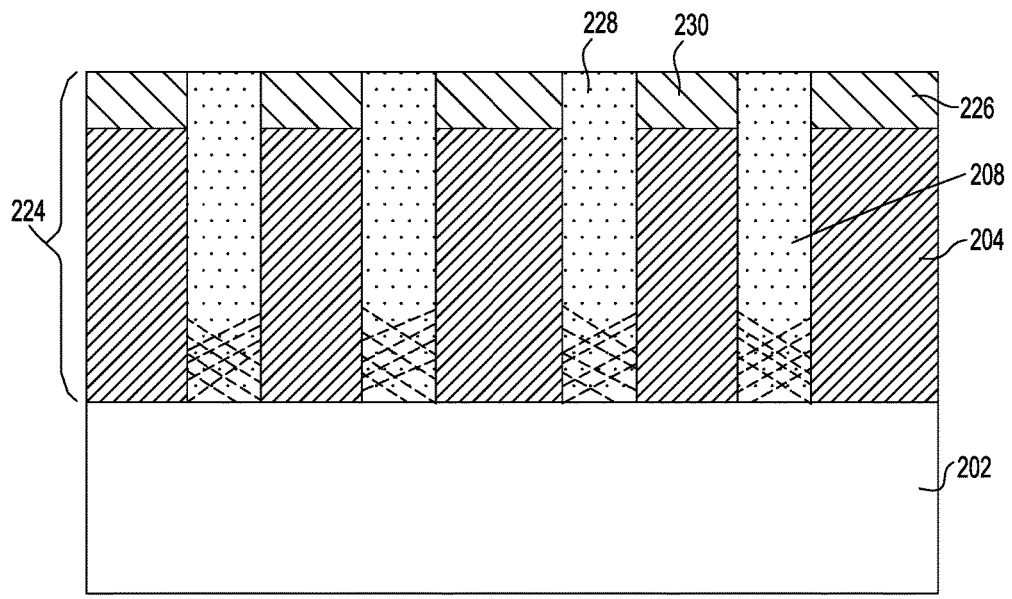
FIG. 17 depicts an alternative embodiment of the structure of FIG. 5, and includes coplanar surfaces of germanium material and a dielectric stack structure disposed over the substrate, in accordance with one or more aspects of the present application.
Figure 18:
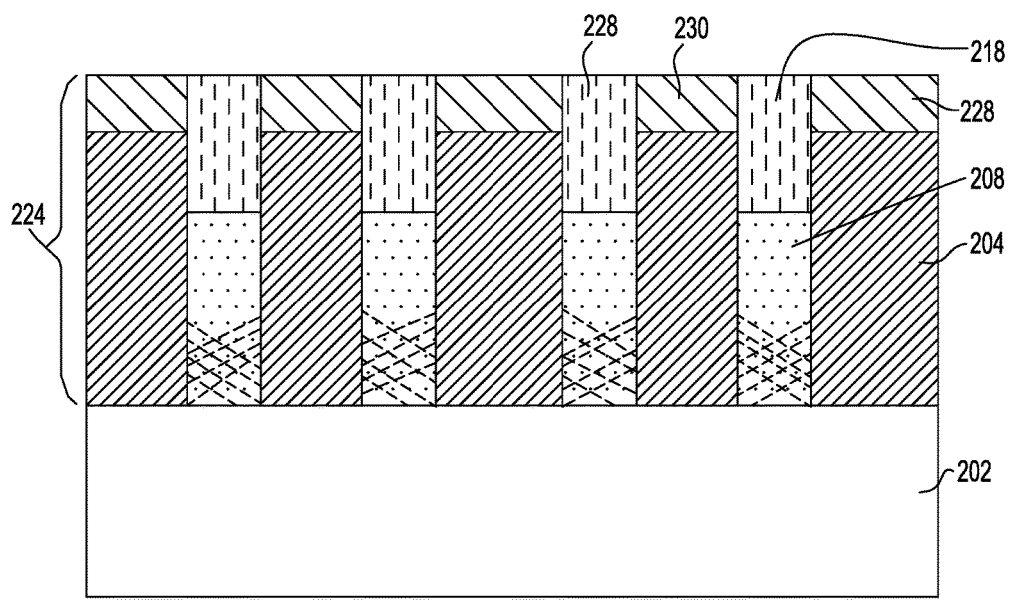
FIG. 18 depicts an alternative embodiment of the structure of FIG. 17, and includes coplanar surfaces of additional semiconductor material and a dielectric stack structure disposed over the substrate, in accordance with one or more aspects of the present application.

Referring now to FIG. 17, there is illustrated an alternative embodiment of the structure of FIG. 5, and includes coplanar surfaces of germanium material 208 and a dielectric stack structure 224 disposed over the substrate 202. As illustrated in FIG. 17, the dielectric layer 204 may, in an additional or an alternate embodiment, be disposed with one or more additional dielectric layer(s) 226. In this embodiment, the dielectric layer 204 and the additional dielectric layer(s) 226 together define one example of a dielectric stack structure 224. By way of example, the additional dielectric layer(s) 226 may be, or include, a dielectric material, such as, for instance, an oxide material (e.g., silicon dioxide, tetraethyl orthosilicate (TEOS), high density plasma (HDP) oxide, low temperature oxide, high aspect ratio process (HARP) oxide or the like), a nitride material (e.g., silicon nitride (SiN)) or oxynitride material (e.g., silicon oxynitride (SiO$_x$N$_y$)) or the like, and may be deposited using any of the conventional deposition techniques described above in connection with the formation of the dielectric layer 204. In some embodiments, the materials of the dielectric layer 204 and the additional dielectric layer 226 may be different. For instance, when the dielectric layer 204 is an oxide material, the additional dielectric layer 226 can be a nitride material or vice versa, which, for instance, results in the additional dielectric layer 226 serving as a polish stop layer, during the subsequent CMP processes. Further, as illustrated in FIG. 18, a portion of the germanium material 208 may be partially etched to form one or more cavities, as described above in connection with FIG. 13. An additional semiconductor material 218, which, in one example, may include or be fabricated of a semiconductor material, such as, silicon germanium or a III-V compound semiconductor material, may be epitaxially grown within the cavities, as described above in connection with FIG. 14. As described above in previous embodiments of the present applications, the additional semiconductor material 218 extends above the upper surface of the dielectric stack structure 224 which, in one embodiment, is subsequently planarized using the first and the second slurry compositions described in the previous embodiments. The result is that the topmost surface 228 of the additional semiconductor material 218 is coplanar with the topmost surface 230 of the additional dielectric layer 226 of the dielectric stack structure 224.

Figure 19:
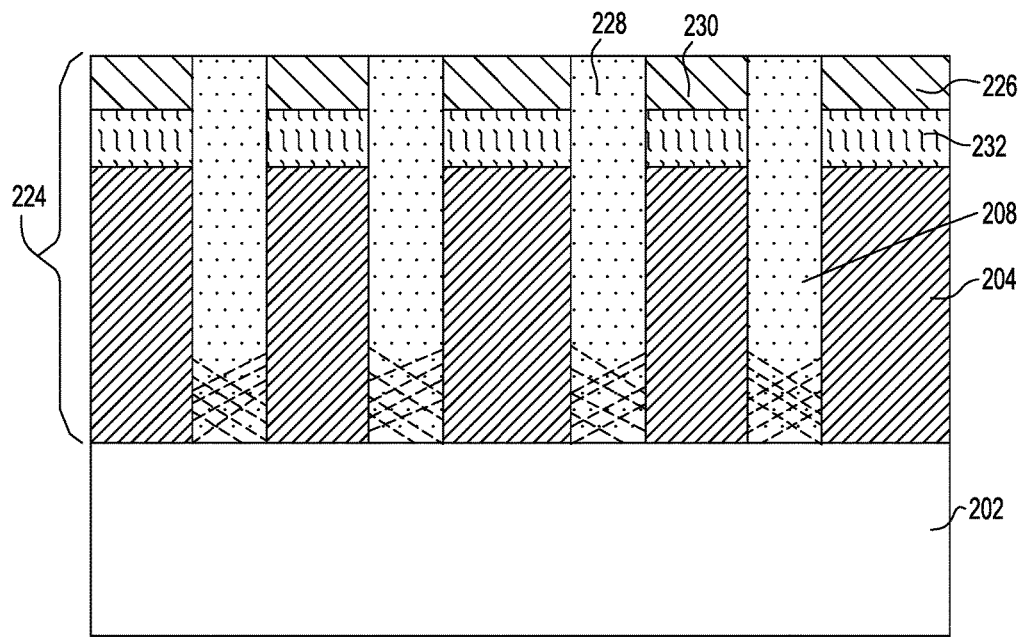
FIG. 19 depicts an alternative embodiment of the structure of FIG. 17, and includes coplanar surfaces of the germanium material and a dielectric stack structure having one or more sacrificial semiconductor layer(s) disposed over the substrate, in accordance with one or more aspects of the present application.

Further, in an additional or an alternative embodiment, the dielectric stack structure 224 may also include one or more sacrificial semiconductor layer(s) 232, as depicted in FIG. 19. By way of example, the sacrificial semiconductor layer 232 may be, or include a silicon germanium material with multiple layers of varying concentrations. In such an embodiment, the additional dielectric layer 226 may serve as a protective layer so as to protect the various underlying layers of the dielectric stack structure 224. As one skilled in the art will understand, the sacrificial semiconductor layer 232 (if present), and the additional dielectric layer 226 over the sacrificial semiconductor layer 232 may be formed over the dielectric layer 204, resulting in the dielectric stack structure 224. The dielectric stack structure 224 may subsequently be patterned and etched to form one or more opening(s) (not shown) using any of the conventional lithographic patterning processes, as described above in connection with the formation of opening(s) 206 in FIG. 2A or FIG. 2B. The germanium material 208 may be subsequently deposited within the openings, as described in previous embodiments, and planarized using the first and/or the second slurry compositions as described in previous embodiments. As depicted further in FIG. 19, the germanium material 208 may be planarized, using the first and the second slurry compositions described in the previous embodiments, resulting in the upper surface 228 of the germanium material 208 being substantially coplanar the upper surface 230 of the additional dielectric layer 226. Note that, as described in the previous embodiments, the one or more slurry compositions, in particular, the second slurry composition described herein has a rate of removal of the additional dielectric material (e.g., oxide and/or nitride materials) that is lower than the rate of removal of the germanium material. In one embodiment, the second slurry composition may be polish-resistant to any of the materials of the additional dielectric layer 226.

Figure 20:
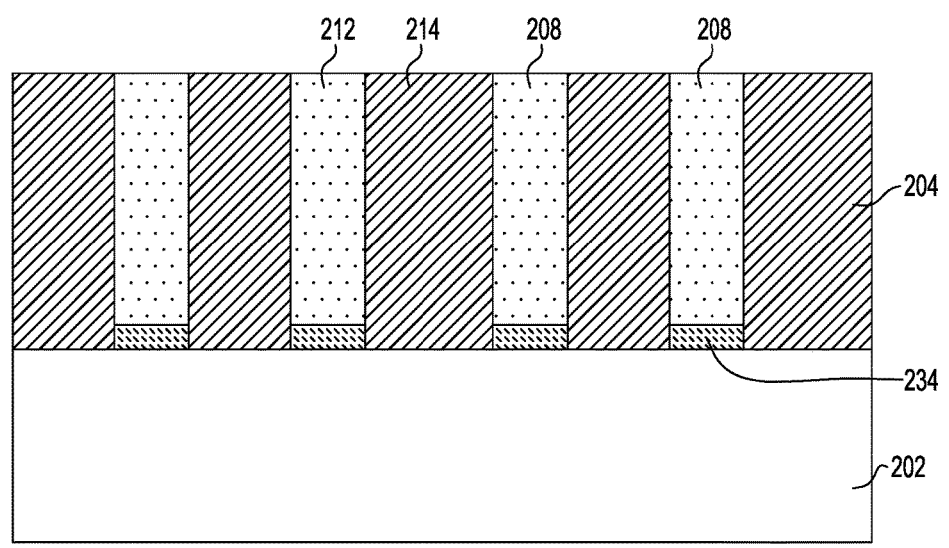
FIG. 20 depicts an alternative embodiment of the structure of FIG. 5, and includes coplanar surfaces of germanium material disposed over a buried template layer, and the dielectric layer, in accordance with one or more aspects of the present application.

Referring now to FIG. 20, there is illustrated an alternative embodiment of the structure of FIG. 5, and includes coplanar surfaces of germanium material 208 disposed over a buried template layer 234, and the dielectric layer 204, in accordance with one or more aspects of the present application. By way of example, the buried template layer 234, which, for instance, may be, or include, any suitable III-V template layer, may be epitaxially grown within the openings 206 of the dielectric layer 204, prior to the epitaxial growth of the germanium layer 208. In such an embodiment, the buried template layer 234 may serve to act as a buffer layer and enable a defect-free epitaxial growth of the germanium material over the exposed portions of the substrate 202. As described above in previous embodiments, the germanium material 208 extends above the upper surface of the dielectric layer 204 which, for instance, is subsequently planarized using the first and the second slurry compositions described in the previous embodiments. The result is that the topmost surface 212 of the germanium material 208 being coplanar with the topmost surface 214 of the dielectric layer 204.

The terminology used herein is for the purpose of describing particular embodiments only and is not intended to be limiting of the application. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including'), and "contain" (and any form of contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present application has been presented for purposes of illustration and description, but is not intended to be exhaustive or limited to the invention in the form disclosed. Many modifications and variations will be apparent to those of ordinary skill in the art without departing from the scope and spirit of the application. The embodiment was chosen and described in order to best explain the principles of one or more aspects of the invention and the practical application, and to enable others of ordinary skill in the art to understand one or more aspects of the present invention for various embodiments with various modifications as are suited to the particular use contemplated.

What is claimed is:

1. A slurry composition for planarizing a germanium material, the slurry composition comprising:
    an abrasive, at least one pH modulator and an oxidizer, wherein the at least one pH modulator comprises at least one of an acidic pH modulator and a basic pH modulator.

2. The slurry composition of claim 1, wherein the abrasive comprises inorganic particles having an average particle diameter of from 5 nm to 500 nm.

3. The slurry composition of claim 2, wherein the inorganic particles comprise silica, alumina, titania, zerconia or ceria.

4. The slurry composition of claim 1, wherein the abrasive comprises organic particles having an average particle diameter of from 5 nm to 500 nm.

5. The slurry composition of claim 4, wherein the organic particles comprise polyvinyl chloride, a styrene (co)polymer, polyacetal, polyester, polyamide, polycarbonate, an olefin (co)polymer, a phenoxy resin, or an acrylic (co)polymer.

6. The slurry composition of claim 1, wherein the at least one pH modulator modulates the slurry composition to a pH of from 1 to 12.

7. The slurry composition of claim 1, wherein the at least one pH modulator includes the acidic pH modulator, and the acidic pH modulator is an inorganic acid.

8. The slurry composition of claim 1, wherein the at least one pH modulator includes the basic pH modulator, and the basic pH modulator comprises one of an organic base and an inorganic base.

9. The slurry composition of claim 1, wherein the oxidizer is present in the slurry composition in an amount from 0.5 to 200 mL/L.

10. The slurry composition of claim 1, wherein the oxidizer comprises ceric ammonium nitrate, ferric nitrate, sodium persulfate, potassium persulfate, hydrogen peroxide, or potassium permanganate.

11. A slurry composition for planarizing a germanium material, the slurry composition comprising:
    an abrasive, at least one pH modulator, and an oxidizer, wherein the at least one pH modulator comprises an acidic pH modulator, and lacks a basic pH modulator.

12. The slurry composition of claim 11, wherein the slurry composition is polish-resistant to at least one dielectric material that provides a dielectric layer.

13. The slurry composition of claim 11, wherein the slurry composition has a rate of removal of the germanium material greater than a rate of removal of the dielectric material.

14. The slurry composition of claim 11, wherein the abrasive comprises inorganic particles having an average particle diameter of from 5 nm to 500 nm.

15. The slurry composition of claim 14, wherein the inorganic particles comprise silica, alumina, titania, zerconia or ceria.

16. The slurry composition of claim 11, wherein the abrasive comprises organic particles having an average particle diameter of from 5 nm to 500 nm.

17. The slurry composition of claim 16, wherein the organic particles comprise polyvinyl chloride, a styrene (co)polymer, polyacetal, polyester, polyamide, polycarbonate, an olefin (co)polymer, a phenoxy resin, or an acrylic (co)polymer.

18. The slurry composition of claim 11, wherein the oxidizer is present in the slurry composition in an amount from 0.5 to 200 mL/L.

19. The slurry composition of claim 11, wherein the oxidizer comprises ceric ammonium nitrate, ferric nitrate, sodium persulfate, potassium persulfate, hydrogen peroxide, or potassium permanganate.

20. The slurry composition of the claim 11, wherein the acidic pH modulator of the slurry composition includes an inorganic acid in an amount from 0.0001% to 0.1% by weight based on a total weight of the slurry composition.

* * * * *